(12) United States Patent
Shin et al.

(10) Patent No.: US 8,338,696 B2
(45) Date of Patent: Dec. 25, 2012

(54) BENZOINDOLE-BASED COMPOUND AND DYE-SENSITIZED SOLAR CELL USING THE SAME

(75) Inventors: Byong-cheol Shin, Suwon-si (KR); Ji-won Lee, Suwon-si (KR); Moon-sung Kang, Suwon-si (KR); Jaejung Ko, Chungnam (KR); Duckhyun Kim, Chungnam (KR)

(73) Assignee: Samsung SDI Co., Ltd., Yongin-si (KR)

( * ) Notice: Subject to any disclaimer, the term of this patent is extended or adjusted under 35 U.S.C. 154(b) by 23 days.

(21) Appl. No.: 12/980,019

(22) Filed: Dec. 28, 2010

(65) Prior Publication Data

US 2011/0088775 A1    Apr. 21, 2011

Related U.S. Application Data

(62) Division of application No. 12/174,974, filed on Jul. 17, 2008, now Pat. No. 7,884,218.

(30) Foreign Application Priority Data

Jan. 8, 2008    (KR) .................................. 2008-2335

(51) Int. Cl.
*H01L 31/42* (2006.01)
*C07D 209/04* (2006.01)
*C07D 209/48* (2006.01)
*C04D 209/90* (2006.01)

(52) U.S. Cl. ......... 136/247; 548/438; 548/469; 548/476

(58) Field of Classification Search ................ 136/256; 548/438, 469, 479; 252/62.2; 424/9.6; 514/245.09, 514/366, 406
See application file for complete search history.

(56) References Cited

U.S. PATENT DOCUMENTS 6,461,804 B1 * 10/2002 Deroover ...................... 430/578
6,656,451 B1 * 12/2003 Achilefu et al. ............... 424/9.6

OTHER PUBLICATIONS

U.S. Office action dated Jul. 22, 2010, for parent U.S. Appl. No. 12/174,974, noting listed reference in this IDS.
U.S. Notice of Allowance dated Nov. 26, 2010, for parent U.S. Appl. No. 12/174,974.

* cited by examiner

*Primary Examiner* — Ling Choi
*Assistant Examiner* — Monique Peets
(74) *Attorney, Agent, or Firm* — Christie, Parker & Hale, LLP

(57) ABSTRACT

A benzoindole-based compound represented by Formula 1 below, a dye including the benzoindole-based compound, and a dye-sensitized solar cell including the dye:

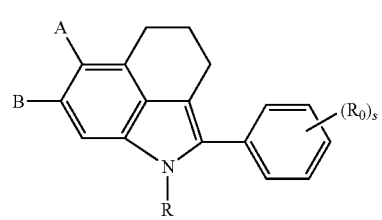

<Formula 1> is prepared at a low cost, has a high molar absorption coefficient, and high photoelectron conversion efficiency, as compared to a conventional ruthenium dye. The benzoindole-based dye is an organic dye including an N-aryl electron donor and an acidic functional group an electron acceptor.

20 Claims, 8 Drawing Sheets

HOMO    LUMO

HOMO    LUMO

BENZOINDOLE-BASED COMPOUND AND DYE-SENSITIZED SOLAR CELL USING THE SAME

CROSS-REFERENCE TO RELATED APPLICATIONS

This application is a divisional of U.S. patent application Ser. No. 12/174,974, filed Jul. 17, 2008, now U.S. Pat. No. 7,884,248 which claims priority to and the benefit of Korean Patent Application No. 2008-2335, filed on Jan. 8, 2008, in the Korean Intellectual Property Office, the entire contents of which are incorporated herein by reference.

BACKGROUND OF THE INVENTION

1. Field of the Invention

Aspects of the present invention relate to a benzoindole-based compound and a dye-sensitized solar cell using the same.

2. Description of the Related Art

Solar cells utilize almost unlimited and environmentally friendly energy sources unlike other energy sources; and, examples of solar cells include silicon solar cells, dye-sensitized solar cells, and the like.

For silicon solar cells, the manufacturing costs are high, and thus, their practical use is difficult to attain and their cell efficiency is difficult to improve.

On the other hand, dye-sensitized solar cells are manufactured at significantly lower costs as compared to silicon-based solar cells, and thus can replace conventional non-crystalline silicon solar cells. In addition, unlike silicon solar cells, the dye-sensitized solar cells are photo-electro-chemical solar cells that include dye molecules that can produce electron-hole pairs by absorbing visible light rays and a transition metal oxide that transfers the produced electron-hole pairs.

As the dye of dye sensitized solar cells, a ruthenium dye is known. However, the ruthenium dye is prepared at an expensive cost. Therefore, research has been actively conducted to replace the ruthenium dye with an organic dye that is prepared at a much lower cost and that also has excellent photoelectric conversion efficiency.

SUMMARY OF THE INVENTION

Aspects of the present invention provide a benzoindole-based compound, a dye for a dye sensitized solar cell, including the same, and a dye sensitized solar cell using the dye, such that the dye is prepared at a low cost and has excellent photoelectric conversion efficiency.

According to an aspect of the present invention, there is provided a benzoindole-based compound represented by Formula 1 below:

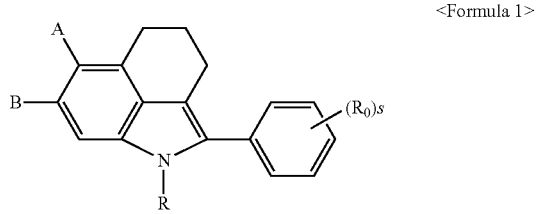

<Formula 1> wherein A and B are each independently hydrogen or -D-E, and both A and B are not hydrogen, D is one selected from the group consisting of a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof, E is an acidic functional group, R is one selected from the group consisting of a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof, $R_0$ is one selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof, and s is an integer of 0 to 5.

According to another aspect of the present invention, there is provided a dye for a dye-sensitized solar cell, the dye comprising the benzoindole-based compound.

According to another aspect of the present invention, there is provided a dye-sensitized solar cell comprising: a first electrode and a second electrode disposed to face each; a porous film that is disposed between the first electrode and the second electrode and is adsorbed with a dye comprising the benzoindole-based compound; and an electrolyte interposed between the first electrode and the second electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
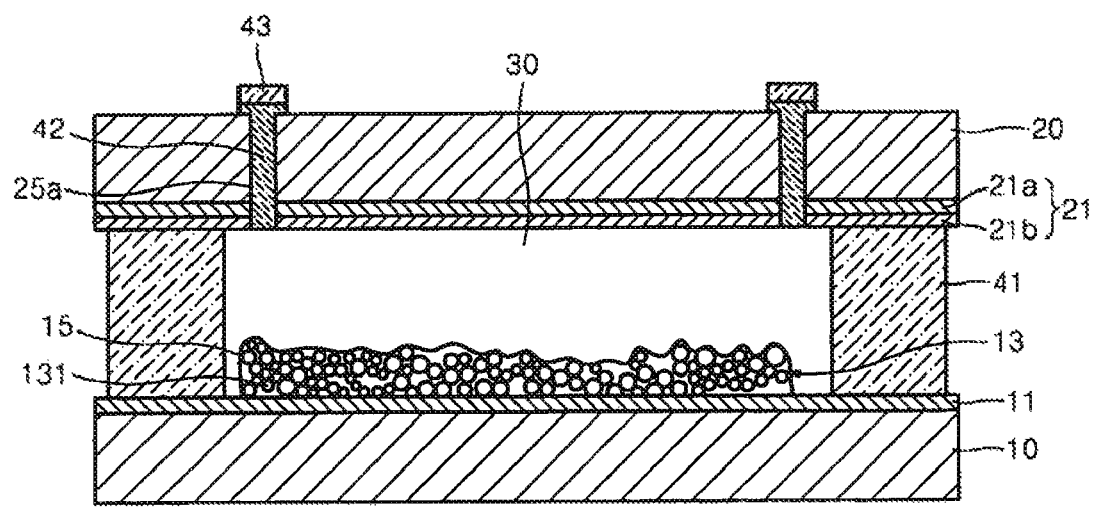
FIG. 1 is a cross-sectional view illustrating a dye-sensitized solar cell according to an embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention with reference to the figures.

Aspects of the present invention provide a benzoindole-based compound represented by Formula 1:

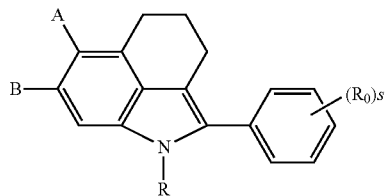

<Formula 1> wherein A and B are each independently hydrogen or -D-E, and both A and B are not hydrogen.

According to aspects of the present invention, D is one selected from the group consisting of a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof.

According to aspects of the present invention, E is an acidic functional group.

According to aspects of the present invention, R is one selected from the group consisting of a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof.

According to aspects of the present invention, $R_0$ is one selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof.

According to aspects of the present invention, s is an integer of 0 to 5. In Formula 1, when s in $(R_0)s$ is 0, $(R_0)_0$ represents hydrogen. Further, when m, n, s, k, and/or p are 0, the corresponding $R_1$, $R_2$, $R_0$, $R_5$, and $R_6$ represent hydrogen.

According to aspects of the present invention, D is represented by the following formula:

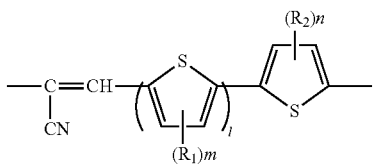

wherein $R_1$ and $R_2$ are each independently one selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof.

According to aspects of the present invention, l is 0 or 1. According to aspects of the present invention, m and n are each independently an integer of 0 to 2. Examples of D may include the following:

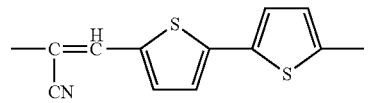

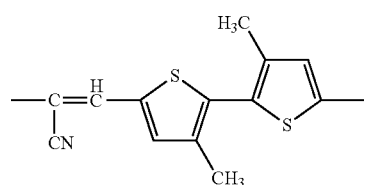

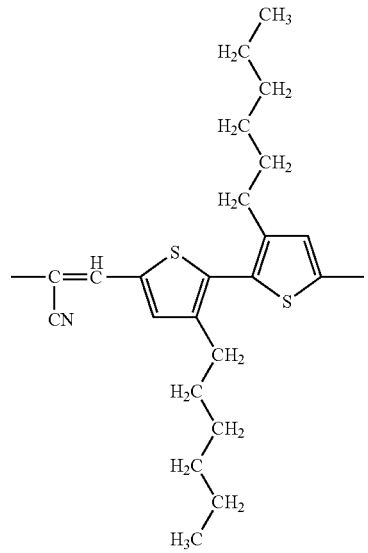

According to aspects of the present invention, A and B may be different from each other and each independently selected from hydrogen and groups represented by the following formula:

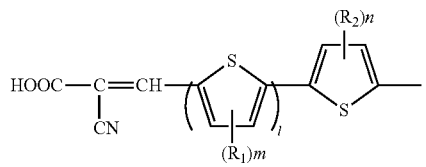

wherein $R_1$ and $R_2$ are each independently one selected from a $C_1$-$C_{20}$ alkyl group, a halogen atom, a nitro group, a cyano group, a $C_1C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof. According to aspects of the present invention, l is 0 or 1, and m and n are each independently an integer of 0 to 2.

According to aspects of the present invention, R may be a fluorene group represented by the following formula:

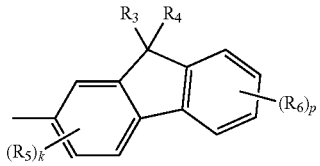

wherein $R_3$ and $R_4$ are each independently one selected from the group consisting of hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof.

According to aspects of the present invention, $R_5$ and $R_6$ are each independently one selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof. According to aspects of the present invention, k is an integer of 0 to 3, and p is an integer of 0 to 4.

Examples of the fluorene group may include the following groups:

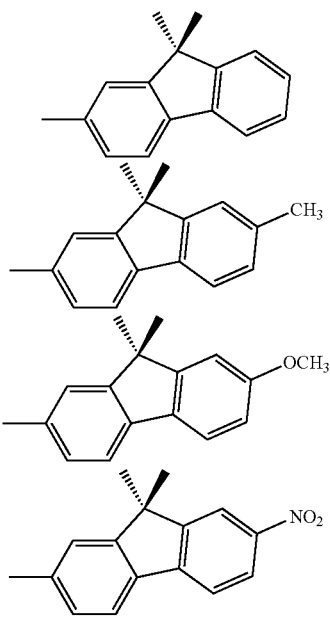

In Formula 1 above, E, which is an acidic functional group, may be a substituent selected from the group consisting of a carboxyl group, a phosphorous acid group, a sulfonic acid group, a phosphinic acid group, a hydroxyl group, oxycarboxylic acid, an acid amide group, a boric acid group, a squaric acid group, and combinations thereof, and may preferably be a carboxyl group.

A benzoindole-based compound according to an embodiment of the present invention may also be a compound represented by Formula 2 or 3 below:

<Formula 2>

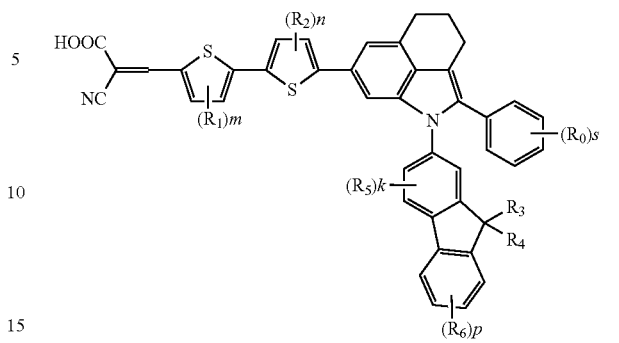

<Formula 3>

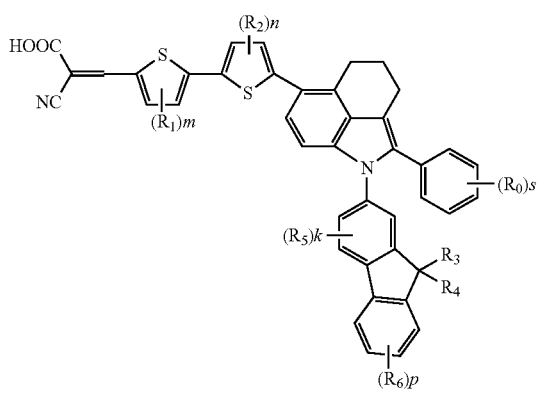

wherein $R_0$ of Formulas 2 and 3 are one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof, s is an integer of 0 to 5.

According to aspects of the present invention, $R_1$ and $R_2$ of Formulas 2 and 3 are each independently one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof. According to aspects of the present invention, m and n are each independently an integer of 0 to 2.

According to aspects of the present invention, $R_3$ and $R_4$ of Formulas 2 and 3 are each independently one selected from hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof.

According to aspects of the present invention, $R_5$ and $R_6$ of Formulas 2 and 3 are each independently one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$, aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof. According to aspects of the present invention, k is an integer of 0 to 3, and p is an integer of 0 to 4.

In particular, a benzoindole-based compound according to an embodiment of the present invention may also be a compound represented by Formula 4 below or a compound represented by Formula 5 below:

<Formula 4>

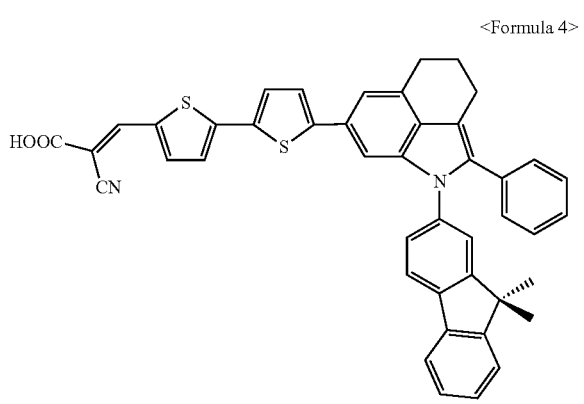

<Formula 5>

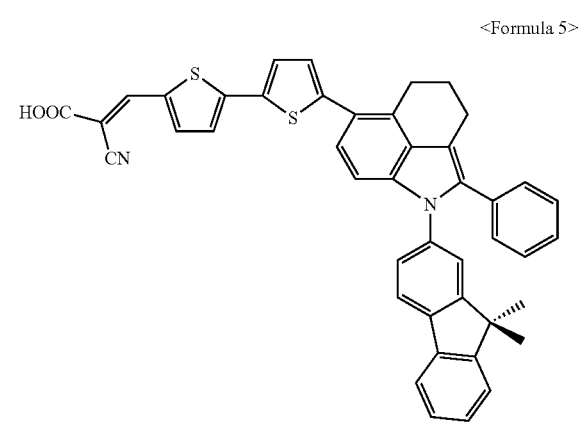

The benzoindole-based compound according to aspects of the present invention is an organic dye comprising benzo[cd] indole as an N-aryl electron donor and an acidic functional group such as —COOH, as an electron acceptor. The benzoindole-based compound can be easily introduced by a desired substituent and be easily prepared yielding a high purity. When the benzoindole-based compound is used in a dye for a dye-sensitized solar cell, the benzoindole-based compound is prepared at a low cost, has a high molar absorption coefficient, and high photoelectron conversion efficiency, as compared to a conventional ruthenium dye.

Hereinafter, a method of preparing a benzoindole-based compound according to an exemplary embodiment of the present invention will be described. In particular, the method of preparing a benzoindole-based compound of Formula 2 and Formula 3 will be described.

First, as shown in Reaction Scheme 1 below, the bromination of compound (A) 1-phenylbenzoindole is performed to respectively obtain corresponding bromides (B) and (C). Herein, the bromination is performed using a brominating agent, such as N-bromosuccinimide, and the reaction temperature may be in a range of −20 to 0° C.

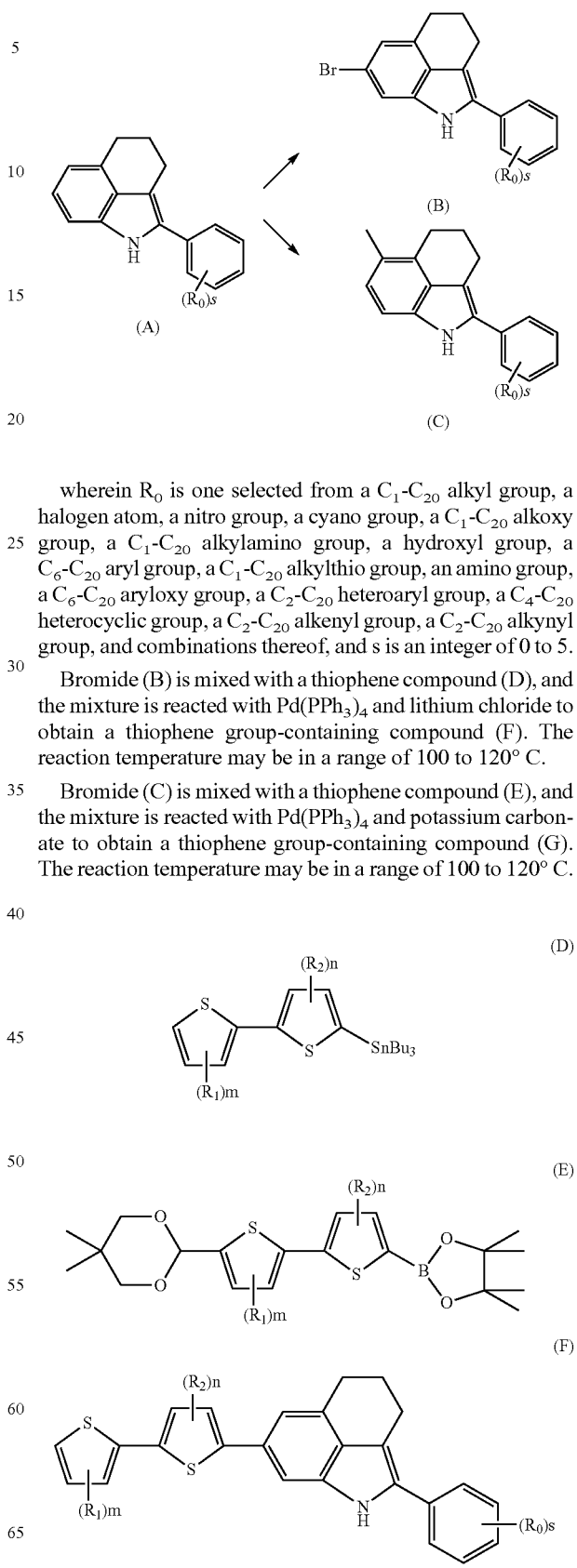

wherein $R_0$ is one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof, and s is an integer of 0 to 5.

Bromide (B) is mixed with a thiophene compound (D), and the mixture is reacted with Pd(PPh$_3$)$_4$ and lithium chloride to obtain a thiophene group-containing compound (F). The reaction temperature may be in a range of 100 to 120° C.

Bromide (C) is mixed with a thiophene compound (E), and the mixture is reacted with Pd(PPh$_3$)$_4$ and potassium carbonate to obtain a thiophene group-containing compound (G). The reaction temperature may be in a range of 100 to 120° C.

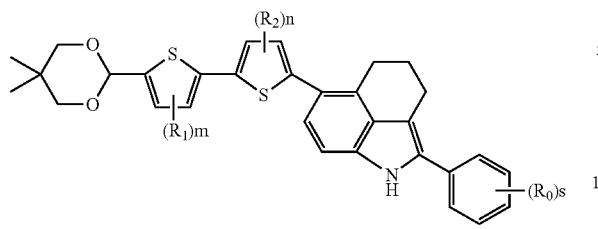

(G)

wherein $R_1$ and $R_2$ are each independently one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocycle group, a $C_2$-$C_{20}$ alkenyl group, a $C_2$-$C_{20}$ alkynyl group, a $C_2$-$C_{20}$ carbocyclic group, and combinations thereof, m and n are each independently an integer of 0 to 2, and $R_0$ and s are the same as described above.

Then, the compounds (F) and (G) are respectively reacted with a fluorene-based compound (Z) represented by the following formula to substitute the fluorene-based compound (Z) for the hydrogen of the nitrogen of the compounds (F) and (G). As a result, compounds (H) and (I) are obtained. According to an exemplary embodiment of the present invention, the reaction is performed using copper and potassium carbonate. The reaction temperature may be in a range of 190 to 200° C.

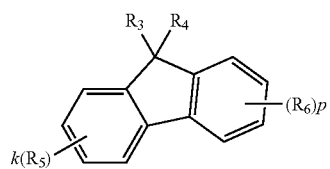

(Z)

(H)

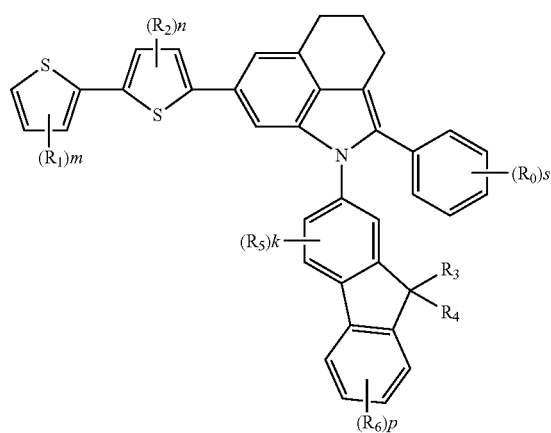

(I)

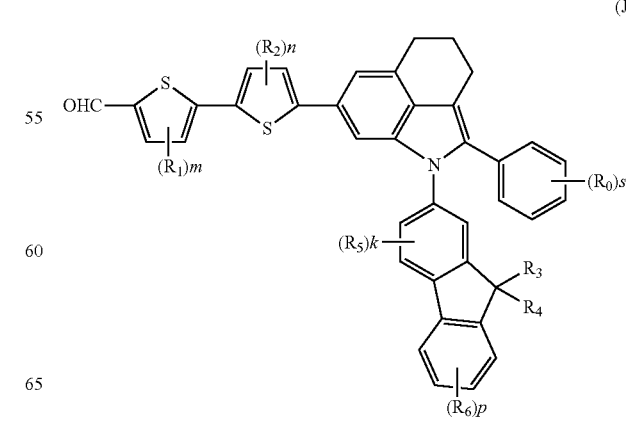

In the above formulas, $R_0$, $R_1$-$R_6$, m, n, s, k, and p are the same as described above. For example, $R_3$ and $R_4$ are each independently one selected from hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocycle group, a $C_2$-$C_{20}$ alkenyl group, a $C_2$-$C_{20}$ alkynyl group, a $C_2$-$C_{20}$ carbocyclic group, and combinations thereof; and, $R_5$ and $R_6$ are each independently one selected from a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, k is an integer of 0 to 3, and p is an integer of 0 to 4.

An aldehyde group is introduced into the compounds (H) and (I) to obtain compounds (J) and (K), respectively. The introduction of the aldehyde group into the compound (H) is performed using alkyl lithium such as n-butyllithium at a temperature in a range of −78 to −40° C. The introduction of the aldehyde group into the compound (I) is performed using trifluoroacetic acid at a temperature in a range of 0 to 25° C.

(J)

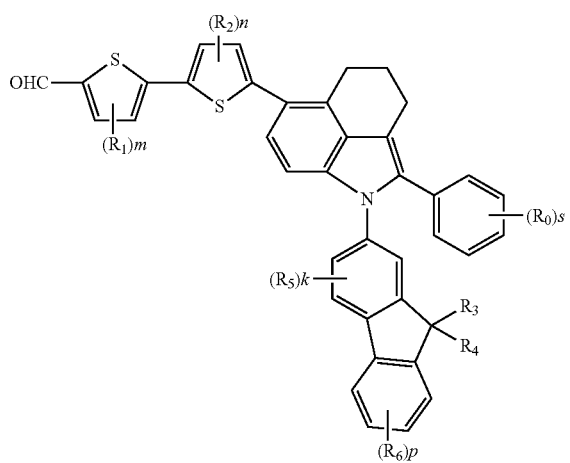

In the above formulas, $R_0$, $R_1$-$R_6$, m, n, s, k, and p are the same as described above.

Next, the compounds (J) and (K) are respectively reacted with cyanoacetic acid, piperidine, and acetonitrile to obtain the compound represented by Formula 2 and the compound represented by Formula 3. The reaction temperature may be in a range of 80 to 100° C.

<Formula 2>

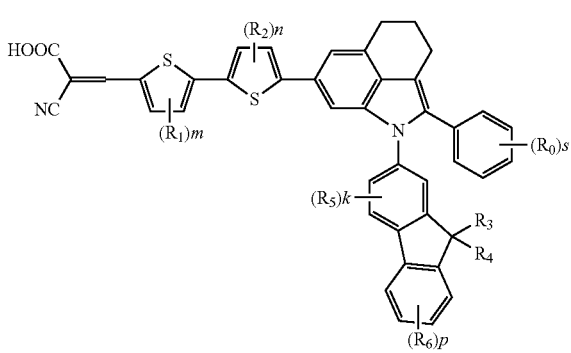

<Formula 3>

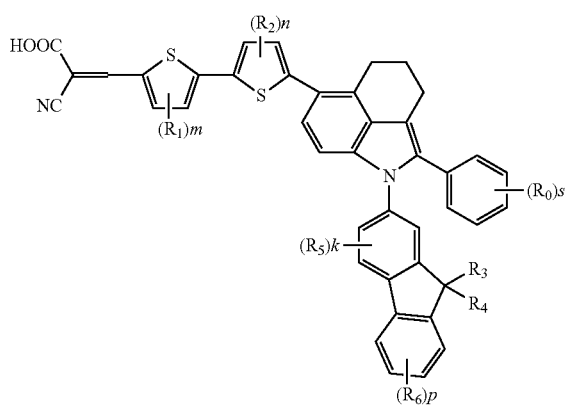

In the above Formulas 2 and 3, $R_0$, $R_1$-$R_6$, m, n, s, k, and p are the same as described above.

The alkyl group used herein may be a linear or branched alkyl and may be methyl, ethyl, propyl, isobutyl, sec-butyl, tert-butyl, pentyl, iso-amyl, hexyl, or the like. At least one hydrogen atom of the alkyl group may be substituted with a halogen atom, a hydroxyl group, a nitro group, a cyano group, an amino group, a $C_1$-$C_{10}$ alkylamino group, a $C_1$-$C_{10}$ alkoxy group, a $C_1$-$C_{10}$ alkylthio group, a $C_6$-$C_{10}$ aryloxy group, an amidino group, hydrazine, hydrazone, or the like.

The alkoxy group used herein may be methoxy, ethoxy, propoxy, or the like. At least one hydrogen atom of the alkoxy group may be substituted with substituents similar to those described above with respect to the alkyl group.

The aryl group used herein refers to a carbocyclic group containing at least one aromatic ring. Herein, the rings can be attached to each other using a pendant method or are fused. The term "aryl" refers to an aromatic radical, including phenyl, naphthyl, tetrahydronaphthyl, or the like. At least one hydrogen atom of the aryl group may be substituted with substituents similar to those described above with respect to the alkyl group substitution.

The heteroaryl group used herein refers to an aryl group containing heteroatoms such as N, O, and S. The heteroaryl group may be thiophene, thiazole, benzothiazole, benzoxazole, or the like. At least one hydrogen atom of the heteroaryl group may be substituted with substituents similar to those described above with respect to the alkyl group substitution.

The carbocyclic group used herein refers to a $C_4$-$C_{20}$ monocyclic system. At least one hydrogen atom of the carbocyclic group may be substituted with substituents similar to those described above with respect to the alkyl group substitution.

The heterocyclic group used herein refers to a $C_4$-$C_{20}$ monocyclic system containing a heteroatom such as N, O, or S. At least one hydrogen atom of the heterocyclic group may be substituted with substituents similar to those described above with respect to the alkyl group substitution.

The alkenyl group used herein refers to an unsaturated aliphatic hydrocarbon having a carbon-carbon double bond, and may be a vinyl group, or the like, At least one hydrogen atom of the alkenyl group may be substituted with substituents similar to those described above with respect to the alkyl group substitution.

The alkynyl group used herein refers to an unsaturated aliphatic hydrocarbon having a carbon-carbon triple bond. At least one hydrogen atom of the alkynyl group may be substituted with substituents similar to those described above with respect to the alkyl group substitution.

Other groups used herein are the same as defined in the corresponding groups described above.

FIG. 1 is a cross-sectional view illustrating a dye-sensitized solar cell according to an exemplary embodiment of the present invention. Referring to FIG. 1, the dye-sensitized solar cell according to the current exemplary embodiment of the present invention includes a first substrate 10 on which a first electrode 11, a porous film 13, and a dye 15 are formed, a second substrate 20 on which a second electrode 21 is formed, and an electrolyte 30 disposed between the first electrode 11 and the second electrode 21 such that the first substrate 10 and the second substrate 20 face each other. A case (not shown) may be disposed at an outer side of the first substrate 10 and the second substrate 20. The structure of the dye-sensitized solar cell will now be described in more detail.

In the current exemplary embodiment, the first substrate 10, on which the first electrode 11 is formed, may be transparent to transmit external light incident on the first substrate 10 to the porous film 13 and the dye 15. Thus, the first substrate 10 may be formed of glass or plastic. The plastic may be polyethylene terephthalate (PET), polyethylene naphthalate (PEN), polycarbonate (PC), polypropylene (PP), polyimide (PI), triacetyl cellulose (TAC), or the like, but aspects of the present invention are not limited thereto.

The first electrode 11 formed on the first substrate 10 may comprise a transparent material, such as $ZnO\text{—}Ga_2O_3$, $ZnO\text{—}Al_2O_3$, at least one selected from indium tin oxide, indium oxide, tin oxide, zinc oxide, sulfur oxide, fluorine oxide, and combinations thereof, or the like, but are not limited thereto. The first electrode 11 may be in the form of a single film or laminated film formed of the transparent materials.

The porous film 13 is formed on the first electrode 11, and comprises metal oxide particles 131 that are formed by self-assembly and have a very fine and uniform average particle diameter. In addition, the porous film 13 has a very fine and uniform pore size; and thus, the porous film can have a uniform nano-porosity. The average pore diameter of the porous film 13 may be in a range of 7,5 to 15 nm. Due to the appropriate average pore size of the porous film 13, the electrolyte 30 can be easily transferred and necking properties of the metal oxide particles 131 can be improved.

In the current exemplary embodiment, the thickness of the porous film 13 may be in a range of 10 to 3000 nm, and preferably in a range of 10 to 1000 nm. However, aspects of the present invention are not limited thereto, and the thickness of the porous film 13 may vary according to technology advancement, and the like.

The metal oxide particles 131 may comprise titanium oxide, zinc oxide, tin oxide, strontium oxide, indium oxide, iridium oxide, lanthanum oxide, vanadium oxide, molybdenum oxide, tungsten oxide, niobium oxide, magnesium oxide, aluminum oxide, yttrium oxide, scandium oxide, samarium oxide, gallium oxide, strontium titanium oxide, or the like. Herein, the metal oxide particles 131 may preferably comprise $TiO_2$, $SnO_2$, $WO_3$, $ZnO$, or complexes thereof. However, aspects of the present invention are not limited thereto.

The dye 15 is adsorbed onto the surface of the porous film 13, and the dye 15 absorbs external light to produce excited electrons. The dye 15 may be the benzoindole-based compound of Formula 1. Such benzoindole-based compound of Formula 1, which is an organic dye that has excellent molar absorption coefficient, high photoelectron conversion efficiency at a visible region of light, and is prepared at a low cost. Thus, the dye 15 according to aspects of the present invention can replace a ruthenium dye, which is an expensive inorganic dye.

The electrolyte 30 comprises an electrolytic solution that includes a redox pair and receives electrons from a counter electrode, i.e., the second electrode 21, by oxidation and reduction to transfer the electrons to the dye 15.

The redox pair comprises iodine ($I_2$) and an iodine salt. $I^-$ and $I_3^-$ ions may be produced from the iodine and the iodine salt and co-exist. Thus, the redox pair provides a reversible reaction.

The iodine salt may be, but is not limited thereto, lithium iodide, sodium iodide, potassium iodide, magnesium iodide, copper iodide, silicone iodide, manganese iodide, barium iodide, molybdenum iodide, calcium iodide, iron iodide, cesium iodide, zinc iodide, mercury iodide, ammonium iodide, methyl iodide, methylene iodide, ethyl iodide, ethylene iodide, isopropyl iodide, isobutyl iodide, benzyl iodide, benzoyl iodide, allyl iodide, and imidazolium iodide.

The amount of the iodine salt may be in a range of 150 to 3,000 parts by weight based on 100 parts by weight of iodine ($I_2$). When the amount of the iodine salt is less than 150 parts by weight based on 100 parts by weight of iodine ($I_2$), a smooth reaction cannot be performed. On the other hand, when the amount of the iodine salt is greater than 3,000 parts by weight based on 100 parts by weight of iodine ($I_2$), the iodine salt interferes with electron flow, thus reducing current therethrough.

An organic solvent included in the electrolytic solution may comprise, but is not limited to, at least one selected from the group consisting of acetonitrile (AN), ethylene glycol, butanol, isobutylalcohol, isopentylalcohol, isopropylalcohol, ethylether, dioxane, tetrahydrofurane, n-butylether, propylether, isopropylether, acetone, methylethylketone, methylbutylketone, methylisobutylketone, ethylene carbonate (EC), diethyl carbonate (DEC), propylene carbonate (PC), dimethyl carbonate (DMC), ethylmethylcarbonate (EMC), y-butyrolactone (GBL), N-methyl-2-pyrolidone, and 3-methoxypropionitrile (MP). The amount of the organic solvent may be in a range of 10 to 90 wt % based on the total amount of the electrolytic solution. However, the organic solvent is not necessarily used. For example, some materials, such as molten salt (imidazolium-based iodine), do not need a solvent since they exist in a liquid state.

The second substrate 20 on which the second electrode 21 is formed is disposed to face the first substrate 10, and the second substrate 20 may be transparent. Thus, the second substrate 20 may comprise glass or plastic similar to the first substrate 10.

The second electrode 21, formed on the second substrate 20, is disposed to face the first electrode 11, i.e., is disposed on the second substrate 20 between the first and second substrates 10 and 20, and may include a transparent electrode 21a and a catalyst electrode 21b. The transparent electrode 21a may comprise a transparent material such as indium tin oxide, fluorine tin oxide, antimony tin oxide, zinc oxide, tin oxide, $ZnO\text{—}Ga_2O_3$, $ZnO\text{—}Al_2O_3$, or the like, but is not limited thereto. Herein, the transparent electrode 21a may be in the form of a single film or laminated film formed of the transparent material. The catalyst electrode 21b activates the redox couple, and may comprise platinum, ruthenium, palladium, iridium, rhodium, osmium, carbon, $WO_3$, $TiO_2$, or the like, but is not limited thereto.

The first substrate 10 and the second substrate 20 are attached to each other using an adhesive 41. The electrolyte 30 is injected into the interior between the first electrode 11 and the second electrode 21 through holes 25a that penetrate the second substrate 20 and the second electrode 21. The electrolyte 30 is diffused into the porous film 13, and the electrolyte 30 may be uniformly diffused therein. The electrolyte 30 receives electrons from the second electrode 21 and transfers the electrons to the dye 15 through reduction and oxidation. The holes 25a, which penetrate the second substrate 20 and the second electrode 21, are sealed by an adhesive 42 and a cover glass 43.

Hereinafter, aspects of the present invention will be described more specifically with reference to the following examples. The following examples are for illustrative purposes only and are not intended to limit the scope of the invention. Synthesis Examples 1 and 2 each begin with the bromination of 2,6,7,8-tetrahydro-1-phenylbenzo[cd]indole (Compound (A)) and are represented in the following Reaction Scheme 2.

<Reaction Scheme 2>
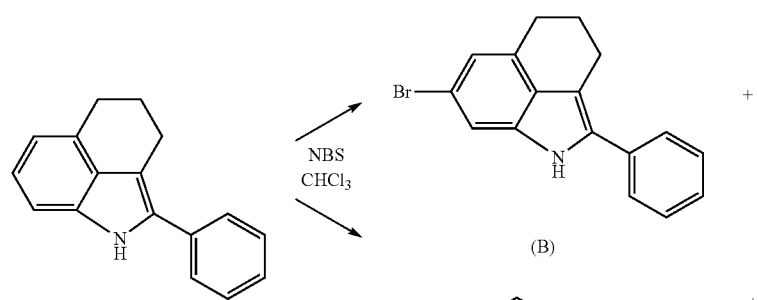
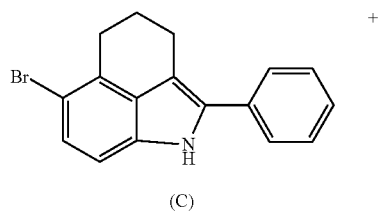
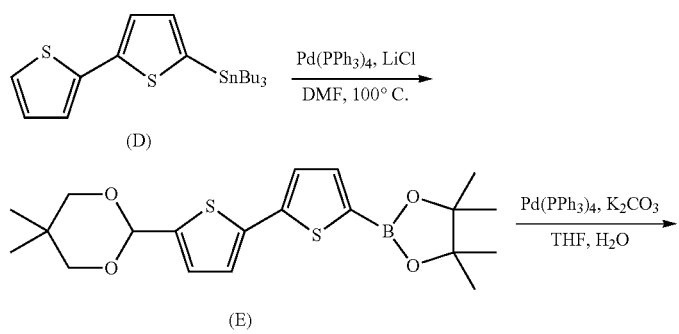
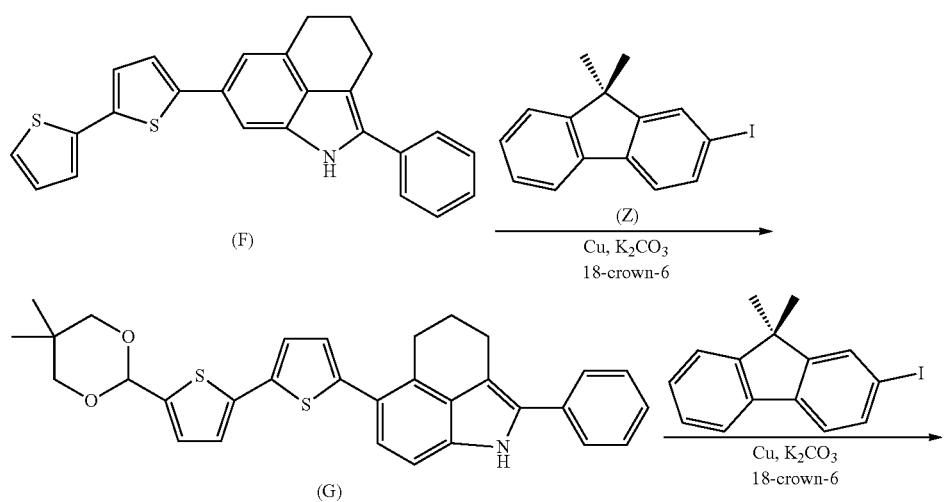

-continued
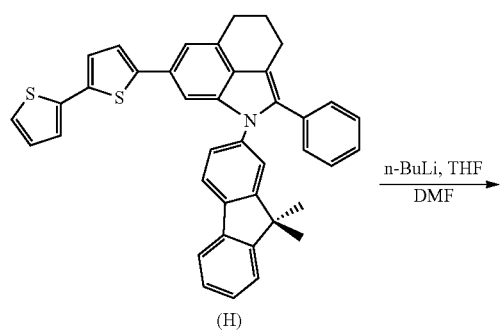
(H)
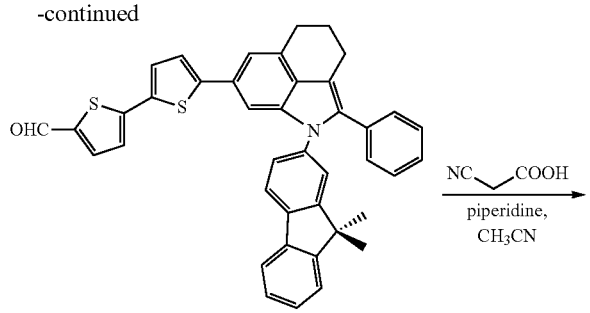
(J)
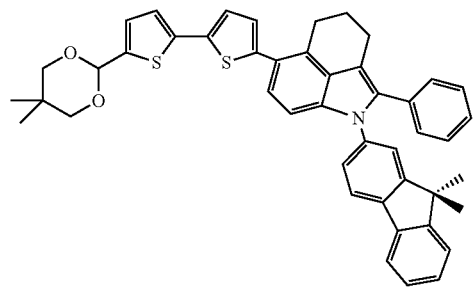
(I)
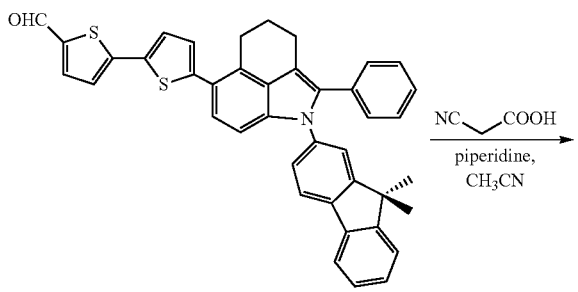
(K)
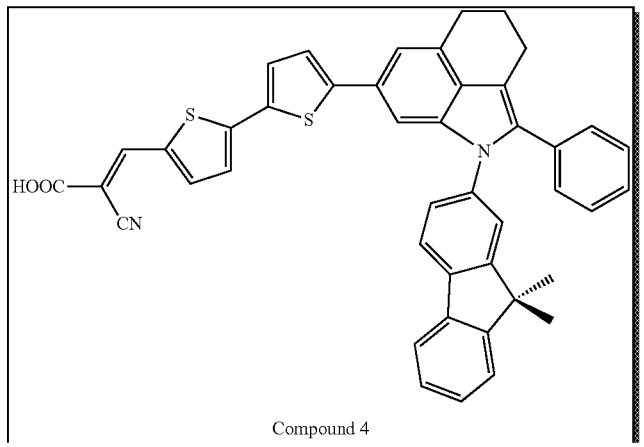
Compound 4
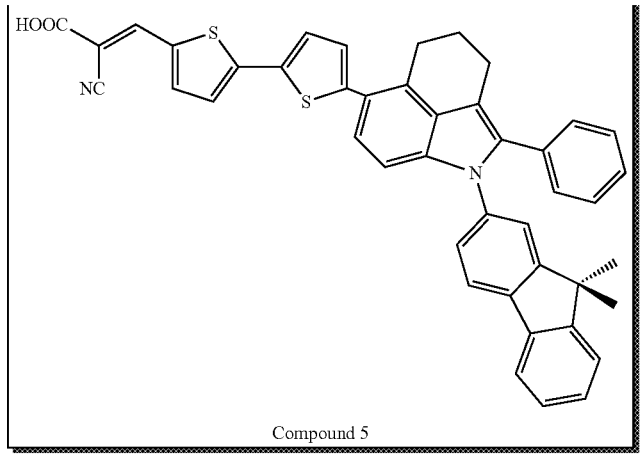
Compound 5

Bromination of Compound (A)

2.64 g of N-bromosuccinimide (NBS) 14.88 mmol) was added dropwise to 100 ml of a $CHCl_3$ solution of 3.65 g of 2,6,7,8-tetrahydro-1-phenylbenzo[cd]indole (Compound (A)) (15.64 mmol) at 0° C. for 30 minutes.

The mixture was stirred at 0° C. for 4 hours, and then a solvent was evaporated from the mixture and the residue was extracted with dichloromethane. Then, the resultant was washed using water, and the organic layer was separated and dried with $MgSO_4$. The solvent was removed from the resultant under a vacuum, and silica gel chromatography was performed on the resultant to obtain pure products 4-bromo-2,6,7,8-tetrahydro-1-phenylbenzo[cd]indole (Compound (B)) (eluent: volume ratio of ethylacetate (EA) to Hx (hexane)=1:10, $R_f$=0.6) and 5-bromo-2,6,7,8-tetrahydro-1-phenylbenzo[cd]indole (Compound (C)) ($R_f$=0.4) in yields of 56% and 41%, respectively.

4-bromo-2,6,7,8-tetrahydro-1-phenylbenzo[cd]indole (Compound (B)) had a melting point (Mp) of 152° C. $^1$H NMR (Acetone-d$_6$) provided δ peaks at 10.36 (s, 1H), 7.74 (d, 2H, J=7.5 Hz), 7.48 (t, 2H, J=7.5 Hz), 7.40 (s, 1H), 7.32 (t, 1H, J=7.5 Hz), 6.94 (s, 1H), 3.04 (t, 2H, J=6.3 Hz), 2.90 (t, 2H, J=6.3 Hz), 2.05 (q, 2H, J=6.3 Hz). $^{13}$C{$^1$H} NMR (Acetone-d$_6$) provided δ peaks of 136.1, 134.7, 133.9, 132.0, 129.6, 128.4, 127.5, 126.9, 119.6, 116.8, 111.8, 111,5, 27.7, 25.2, 23.7. Mass spectrometry (MS) provided a mass to charge ratio (m/z) of 311 [M$^+$]. For Compound (B), Anal. Calcd. for $C_{17}H_{14}BrN$: C, 65.40; H, 4.52; Found: C, 65.23; H, 4.45.

5-bromo-2,6,7,8-tetrahydro-1-phenylbenzo[cd]indole (Compound (C)) had a Mp of 155° C.; $^1$H NMR (CDCl$_3$): δ 7.99 (s, 1H), 7.58 (d, 2H, J=7.2 Hz), 7.47 (t, 2H, J=7.2 Hz), 7.33 (t, 1H, J=7.2 Hz), 7.27 (d, 1H, J=8.4 Hz), 7.06 (d, 1H, J=8.4 Hz), 3.02 (t, 2H, J=6.0 Hz), 2.96 (t, 2H, J=6.0 Hz), 2.11 (q, 2H, J=6.0 Hz); $^{13}$C{$^1$H} NMR (CDCl$_3$): δ 133.2, 133.0, 131.8, 131.4, 130.4, 129.1, 127.2, 126.3, 126.1, 111.5, 111.4, 109.7, 27.8, 24.4, 22.8. MS: m/z 311 [M$^+$]; Anal. Calcd. for $C_{17}H_{14}BrN$: C, 65.40;H, 4.52;and Found: C, 65.20;H, 4.46.

SYNTHESIS EXAMPLE 1

Preparation of the Compound of Formula 4 (JK-51)

Preparation of 2,6,7,8-tetrahydro-1-phenyl-4-(5-(thiophene-2-yl)thiophene-2-yl)benzo[cd]indole (Compound (F))

0.6 g of Compound (B) (1.92 mmol), 0.88 g of tributyl(5-(thiophene-2-yl)thiophene-2-yl)tin (Compound (D)) (1.92 mmol), 0.11 g of Pd(PPh$_3$)$_4$ (0.096 mmol), 0.41 g of LiCl (9.6 mmol), and 30 ml of dimethylformamide were stirred at 100° C. for 12 hours. The mixture was cooled down, and then 50 ml of H$_2$O was added to the mixture, and the resultant was extracted with dichloromethane (50 mL×5).

The obtained organic layer was dried with MgSO$_4$, the solvent was removed from the resultant in vacuum, and then silica gel chromatography (eluent MC:Hx=1:3, $R_f$=0.3) was performed on the resultant to obtain a white solid Compound (F) (yield: 88%). Compound (F) exhibited Mp: 122° C.; $^1$H NMR (Acetone-d$_6$): δ 10.33 (s, 1H), 7.75 (d, 2H, J=7.5 Hz), 7.48 (t, 2H, J=7.5 Hz), 7.47 (d, 1H, J=4.2 Hz), 7.40 (d, 1H, J=5.1 Hz), 7.32 (t, 1H, J=7.5 Hz), 7.31 (s, 1H), 7.28 (d, 1H, J=4.2 Hz), 7.22 (d, 1H, J=3.6 Hz), 7.12 (s, 1H), 7.08 (dd, 1H, J=3.6 Hz, J=5.1 Hz), 3.08 (t, 2H, J=6.0 Hz), 2.96 (t, 2H, J=6.0 Hz), 2.10 (q, 2H, J=6.0 Hz); $^{13}$C{$^1$H} NMR (Acetone-d$_6$): δ 146.7. 138.3, 135.9, 135.7, 134.2, 133.5, 132.7, 129.8, 129.7, 129.6, 128.9, 127.5, 126.9, 125.6, 125.2, 124.2, 123.6, 115.1, 112.0, 106.2, 27.4, 25.5, 24.0; MS: m/z 397 [M$^+$]; Anal. Calcd. for $C_{25}H_{19}NS_2$: O. 75.53;H, 4.82;and Found: C, 75.34;H, 4.62.

Preparation of 2,6,7,8-tetrahydro-2-(9,9-dimethyl-9H-fluorene-2-yl)-1-phenyl-4-(5-(thiophene-2-yl)thiophene-2-yl)benzo[cd]indole (Compound (H))

0.70 g of Compound (F) (1.76 mmol), 0.84 g of 2-iodo-9,9-dimethylfluorene (2.64 mmol), 0.49 g of anhydrous potassium carbonate powder (3.52 mmol), 0.11 g of copper bronze (1.76 mmol), 0.07 g of 18-crown-6 (0.26 mmol), and 40 ml of 1,2-dichlorobenzene were refluxed for 48 hours. The mixture was cooled down, the insoluble materials were removed by filtration, and the resultant was washed with dichloromethane (3×30 ml). The obtained filtrate and organic layer were washed with ammonia water and the resultant was dried with magnesium sulfate.

The solvent was removed from the resultant under reduced pressure, and silica gel chromatography (eluent MC:Hx=1:3, $R_f$=0.6) was performed on the resultant to obtain Compound (H) in a yield of 84%. Compound (H) exhibited: Mp: 129° C.; $^1$H NMR (CDCl$_3$): δ 7.79 (d, 1H, J=8.1 Hz), 7.75 (d, 1H, J=6.9 Hz), 7.49 (s, 1H), 7.41 (t, 2H, J=6.6 Hz), 7.38 (d, 1H, J=4.8 Hz), 7.34 (t, 1H, J=7.2 Hz), 7.25-7.15 (m, 9H), 7.12 (d, 1H, J=3.9 Hz), 7.11 (s, 1H), 7.01 (dd, 1H, J=3.9 Hz, J=4.8 Hz), 3.05 (m, 4H), 2.16 (q, 2H, J=6.0 Hz), 1.33 (s, 6H); $^{13}$C{$^1$H} NMR (CDCl$_3$): δ 154.8. 153.9, 146.1, 145.8, 138.7, 138.0, 137.5, 136.5, 135.6, 134.2, 133.1, 132.2, 129.8, 129.7, 128.2, 128.0, 127.9, 127.4, 127.2, 126.9, 125.7, 124.7, 124.0, 123.3, 122.9, 122.8, 122.2, 120.6, 120.2, 115.9, 114.4, 105.4, 46.9, 27.8, 26.9, 24.7, 22.8; MS: m/z 589 [M$^+$]; Anal. Calcd. for $C_{40}H_{31}NS_2$: C. 81.45;H. 5.30; Found: C, 81.17;H, 5.22.

Preparation of 5-(5-(2,6,7,8-tetrahydro-2-(9,9-dimethyl-9H-fluorene-2-yl)-1-phenylbenzo[cd]indole-4-yl)thiophene-2-yl)thiophene-2-carbaldehyde (Compound (J))

0.47 g of Compound (H) (0.80 mmol) was dissolved in 30 ml of tetrahydrofurane, and the mixture was cooled to −78° C. under a nitrogen (N$_2$) atmosphere. 1.25 ml of n-butyllithium (1.6 M solution in hexane, 2.01 mmol) was added dropwise to the mixture for 10 minutes while the mixture was vigorously stirred. The mixture was stirred at 0° C. for 1 hour, and maintained at 0° C. for another hour. The mixture was cooled to −78° C., and then 1 ml of dry dimethylformamide was added to the mixture at once. Then, the temperature of the mixture was raised to room temperature, and the mixture was stirred overnight. The mixture was quenched using 20 ml of water and extracted with dichloromethane (3×20 mL).

The obtained organic extracts were dried with anhydrous MgSO$_4$ and filtered. Silica gel chromatography (eluent MC:Hx=1:1, $R_f$=0.3) was performed on the resultant to obtain Compound (J) in a yield of 88%. Compound (J) exhibited: Mp: 183° C.; $^1$H NMR (CDCl$_3$): δ 9.86 (s, 1H), 7.82 (d, 1H, J=8.1 Hz), 7.76 (d, 1H, J=6.9 Hz), 7.67 (d, 1H, J=4.2 Hz), 7.51 (s, 1H), 7.43 (t, 2H, J=8.1 Hz), 7.41 (d, 1H, J=8.1 Hz), 7.37 (t, 1H, J=6.9 Hz), 7.34 (d, 1H, J=4.2 Hz), 7.32-7.20 (m, 8H), 7.12 (s, 1H), 3.06 (m, 4H), 2.18 (q, 2H, J=6.0 Hz), 1.35 (s, 6H); $^{13}$C{$^1$H} NMR (CDCl$_3$): δ 182.5, 154.8, 153.9, 149.1, 147.9, 141.2, 138.6, 137.8, 137.6, 136.4, 134.7, 134.1, 133.9, 133.3, 132.1, 129.7, 129.0, 129.0, 128.4, 128.2, 127.5, 127.3, 127.0, 125.6, 123.6, 123.4, 122.8, 122.2, 120.7, 120.2, 115.9, 114.4, 105.7, 46.9, 27.8, 26.9, 24.7, 22.7; MS: m/z 617 [M$^+$]; Anal. Calcd. for $C_{41}H_{31}NOS_2$: C, 79.71; H, 5.06;and Found: C, 79.49;H, 5.01.

Preparation of 2-cyano-3-(5-(5-(2,6,7,8-tetrahydro-2-(9,9-dimethyl-9H-fluorene-2-yl)-1-phenylbenzo[cd]indole-4-yl)thiophene-2-yl)thiophene-2-yl)acrylic acid Represented by Formula 4

0.29 g of Compound (J) (0.47 mmol) and 0.060 g of cyanoacetic acid (0.70 mmol) were dried under a vacuum, and then 20 ml of acetonitrile and 0.046 ml of piperidine were added thereto. The mixture was refluxed for 6 hours.

The mixture was cooled down, the organic layer was dried in vacuum, and silica gel chromatography (eluent EA:MeOH=10:1, $R_f$=0.2) was performed on the resultant to obtain 0.29 g of a compound of Formula 4 in a yield of 91%. The compound of Formula 4 exhibited: Mp: 236° C.; $^1$H NMR (DMSO-$d_6$): δ 8.08 (s, 1H), 7.94 (d, 1H, J=8.1 Hz), 7.85 (d, 1H, J=6.9 Hz), 7.63 (d, 1H, J=3.9 Hz), 7.51 (d, 1H, J=6.6 Hz), 7.42-7.19 (m, 14H), 2.95 (m, 4H), 2.03 (m, 2H), 1.27 (s, 6H); $^{13}$C{$^1$H} NMR (DMSO-$d_6$): δ 163.6, 154.3, 153.5, 146.3, 141.4, 140.2, 137.8, 137.2, 136.9, 136.3, 135.9, 135.4, 134.1, 133.5, 132.9, 131.3, 129.2, 128.4, 128.2, 127.6, 127.5, 127.2, 127.0, 126.8, 125.4, 124.0, 123.9, 122.8, 121.9, 121.1, 120.3, 119.3, 115.2, 113.9, 109.1, 104.6, 46.4, 27.0, 26.4, 24.0, 22.0;MS: m/z 684 [M$^+$]; Anal. Calcd. for $C_{44}H_{32}N_2O_2S_2$: C, 77.16;H, 4.71;and Found: C, 76.92;H, 4.63.

SYNTHESIS EXAMPLE 2

Preparation of the Compound of Formula 5 (JK-52)

Preparation of 2,6,7,8-tetrahydro-5-(5-(5-(5,5-dimethyl-1,3-dioxane-2-yl)thiophene-2-yl)thiophene-2-yl)-1-phenylbenzo[cd]indole (Compound (G))

10 ml of a THF solution of 1.00 g of 4,4,5,5-tetramethyl-2-(5-(5-(5,5-dimethyl-1,3-dioxane-2-yl)thiophene-2-yl)thiophene-2-yl)-1,3,2-dioxaborolane (Compound (E)) (2.46 mmol), 2.76 g of potassium carbonate (20 mmol), and 20 ml of $H_2O$ were added to a mixture of 0,64 g of Compound (C) (2.05 mmol), 0.12 g of triphenylphosphine palladium (Pd (PPh$_3$)$_4$) (0.103 mmol), and 10 ml of tetrahydrofurane using a cannula. The mixture was refluxed for 18 hours and cooled down, then 30 ml of $H_2O$ were added to the resultant, and the resultant was extracted with dichloromethane (30 mL×3). The organic layer was separated and dried using MgSO$_4$.

The solvent was removed in vacuum from the resultant, and then silica gel chromatography (eluent MC:Hx=1:1, $R_f$=0.2) was performed on the resultant to obtain a white solid Compound (G) in a yield of 90%. Compound (G) exhibited: Mp: 131° C.; $^1$H NMR (Acetone-$d_6$): δ 10.33 (s, 1H), 7.75 (d, 2H, J=7.5 Hz), 7.48 (t, 2H, J=7.5 Hz), 7.47 (d, 1H, J=4.2 Hz), 7.33 (d, 1H, J=8.1 Hz), 7.31 (t, 1H, J=7.5 Hz), 7.25 (d, 1H, J=4.2 Hz), 7.12 (d, 1H, J=4.2 Hz), 7.07 (d, 1H, J=8.1 Hz), 7.04 (d, 1H, J=4.2 Hz), 5.66 (s, 1H), 3.69 (m, 4H), 3.07 (m, 4H), 2.04 (m, 2H), 1.20 (s, 3H), 0.79 (s, 3H); $^{13}$C{$^1$H} NMR (Acetone-$d_6$): δ 144.2, 141.6, 138.3, 136.5, 135.4, 134.2, 132.2, 130.2, 129.7, 127.5, 127.1, 126.9, 126.7, 125.1, 125.0, 123.2, 122.3, 112.4, 109.7, 98.8, 77.8, 30.7, 27.5, 25.5, 23.7, 23.2, 21.8;MS: m/z 511 [M$^+$]; Anal. Calcd. for $C_{31}H_{29}NO_2S_2$: C, 72.76;H, 5.71;and Found: C, 72.48;H, 5.66.

Preparation of 2,6,7,8-tetrahydro-5-(5-(5-(5,5-dimethyl-1,3-dioxane-2-yl)thiophene-2-yl)thiophene-2-yl)-2-(9,9-dimethyl-9H-fluorene-2-yl)-1-phenyl-benzo[cd]indole (Compound (I))

Compound (I) was prepared in a yield of 77% in the same manner as in the preparation method of Compound (H), except that Compound (G) was used instead of Compound (F). Compound (I) exhibited: Mp: 144° C.; $^1$H NMR (CDCl$_3$): δ 7.75 (d, 1H, J=7.8 Hz), 7.72 (d, 1H, J=7.8 Hz), 7.43-7.17 (m, 12H), 7.09 (s, 1H), 7.06 (d, 1H, J=5.1 Hz), 7.05 (d, 1H, J=8.1 Hz), 7.02 (d, 1H, J=3.3 Hz), 5.63 (s, 1H), 3.78 (d, 2H, J=11.1 Hz), 3.65 (d, 2H, J=11.1 Hz), 3.22 (m, 2H), 3.02 (m, 2H), 2.13 (m, 2H), 1.32 (s, 6H), 1.31 (s, 3H), 0.81 (s, 3H); $^{13}$C{$^1$H} NMR (CDCl$_3$): δ 154.8, 153.9, 143.2, 139.9, 138.7, 138.3, 137.9, 137.5, 136.3, 135.8, 134.0, 132.2, 130.1, 129.8, 128.2, 127.4, 127.2, 126.9, 126.3, 125.9, 125.7, 125.2, 124.2, 123.2, 122.8, 122.7, 122.2, 120.5, 120.2, 114.8, 108.4, 98.4, 77.7, 46.9, 30.4, 27.3, 26.9, 24.7, 23.1, 22,5, 22.0; MS: m/z 703 [M$^+$]; Anal. Calcd. for $C_{46}H_{41}NO_2S_2$: C, 78.48; H, 5.87;and Found: C, 78.37;H, 5.79.

Preparation of 5-(5-(2,6,7,8-tetrahydro-2-(9,9-dimethyl-9H-fluorene-2-yl)-1-phenylbenzo[cd]indole-5-yl)thiophene-2-yl)thiophene-2-carbaldehyde (Compound (K))

20 ml of THF and 50 ml of water were added to a flask containing 0.30 g of Compound (I) (0.43 mmol), and then 0.1 ml of trifluoroacetic acid (TFA) was added to the mixture. The reaction mixture was stirred at room temperature for 2 hours, and then the resultant was quenched with saturated water-soluble sodium bicarbonate and extracted with dichloromethane. The obtained organic layer was washed with 2% w/v of water-soluble sodium bicarbonate, and dried with sodium sulfate. Then, the resultant was evaporated in vacuum to remove the solvent therefrom.

Silica gel chromatography (eluent MC:Hx=1:1, $R_f$=0.4) was performed on the resultant to obtain Compound (K) as a yellow solid in a yield of 96%. Compound (K) exhibited: Mp: 181° C.; $^1$H NMR (CDCl$_3$): δ 9.87 (s, 1H), 7.76 (d, 1H, J=8.1 Hz), 7.73 (d, 1H, J=8.1 Hz), 7.68 (d, 1H, J=3.9 Hz), 7.42-7.20 (m, 13H), 7.10 (d, 1H, J=3.9 Hz), 7.09 (s, 1H), 3.22 (m, 2H), 3.03 (m, 2H), 2.14 (m, 2H), 1.32 (s, 6H); $^{13}$C{$^1$H} NMR (CDCl$_3$): δ 182.6, 154.8, 153.9, 147.9, 146.3, 141.3, 138.6, 137.8, 137.7, 137.6, 136.1, 134.8, 134.3, 132.1, 130.3, 129.8, 128.2, 127.5, 127.3, 127.0, 126.8, 126.7, 125.7, 125.0, 123.8, 123.8, 122.8, 122.1, 120.6, 120.2, 114.7, 108.5, 46.9, 27.3, 26.9, 24.7, 22.5;MS: m/z 617 [M$^+$]; Anal. Calcd. for $C_{41}H_{31}NOS_2$: C, 79.71; H, 5.06;and Found: C, 79.46; H, 4.92.

Preparation of 2-cyano-3-(5-(5-(2,6,7,8-tetrahydro-2-(9,9-dimethyl-9H-fluorene-2-yl)-1-phenylbenzo[cd]indole-5-yl)thiophene-2-yl)thiophene-2-yl)acrylic acid Represented by Formula 5

A compound of Formula 5 was prepared as a red solid in a yield of 94% in the same manner as in the preparation method of the compound of Formula 4, except that Compound (K) was used instead of Compound (J). The compound of Formula 5 exhibited: Mp: 251° C.; $^1$H NMR (DMSO-$d_6$): δ 8.09 (s, 1H), 7.88 (d, 1H, J=8.1 Hz), 7.82 (d, 1H, J=8.1 Hz), 7.66 (d, 1H, J=3.9 Hz), 7.50-7.15 (m, 15H), 3.13 (m, 2H), 2.91 (m, 2H), 2.01 (m, 2H), 1.25 (s, 6H); $^{13}$C{$^1$H} NMR (DMSO-$d_6$): δ 163.4, 154.3, 153.4, 143.7, 141.3, 140.0, 137.8, 137.1, 137.0, 136.1, 135.9, 135.6, 135,4, 134.4, 133.6, 131.3, 129.4, 129.3, 128.1, 127.6, 127.5, 127.2, 126.9, 126.1, 125.5, 124.6, 124.0, 122.8, 122.0, 121.9, 120.9, 120.3, 119.4, 114.1, 109.5, 108.4, 46.4, 27.1, 26.4, 24.1, 21.7; MS: m/z 684 [M+]; Anal. Calcd. for $C_{44}H_{32}N_2O_2S_2$: C, 77.16; H, 4.71;and Found: C, 76.91; H, 4.62.

EXAMPLE 1

Manufacture of Dye-Sensitized Solar Cell

A dispersion comprising titanium oxide particles having diameters of about 10~25 nm was coated on a 1 cm² area of a first electrode formed of ITO using a doctor blade. The resultant was heat-treated and sintered at 450° C. for 30 minutes to prepare a porous film having a thickness of 10 μm.

Then, the temperature of the resultant was maintained at 80° C., and the resultant was impregnated with 0.3 mM of a dye dispersion in which the compound of Formula 4 was dissolved in ethanol, and a dye adsorption treatment was performed for 12 hours or more. The dye-adsorbed porous film was cleaned using ethanol and dried at room temperature to manufacture the first electrode including a light absorption layer.

Separately, a second electrode was manufactured by depositing a second conductive film formed of Pt on the first conductive film of ITO using a sputtering method. In order for injection of an electrolyte, fine holes were formed using a drill having a diameter of 0.75 mm.

A support, which was formed of a thermoplastic polymer film and had a thickness of 60 μm, was positioned between the first electrode with the porous film formed thereon and the second electrode. Then, the resultant was pressed under pressure at 100° C. for 9 seconds to join the first and second electrodes together. Then, the electrolyte was injected into the interior between the first electrode and the second electrode through the fine holes formed in the second electrode. The electrolyte used was prepared by dissolving 1-hexyl-2,3-dimethylimidazoliumiodide, 0.1 M of lithium iodide, 0.05 M of iodine, and 0.5 M of 4-tert-butylpyridine in 3-methoxypropionitrile. The fine holes were sealed using a cover glass and a thermoplastic polymer film to complete the manufacture of the dye-sensitized solar cell,

EXAMPLE 2

Manufacture of Dye-Sensitized Solar Cell

A dye-sensitized solar cell was manufactured in the same manner as in Example 1, except that the compound of Formula 5 was used instead of the compound of Formula 4.

REFERENCE EXAMPLE 1

Manufacture of Dye-Sensitized Solar Cell

A dye-sensitized solar cell was manufactured in the same manner as in Example 1, except that an N719 dye (Ruthenium 535-bisTBA) represented by the following formula was used instead of the compound of Formula 4.

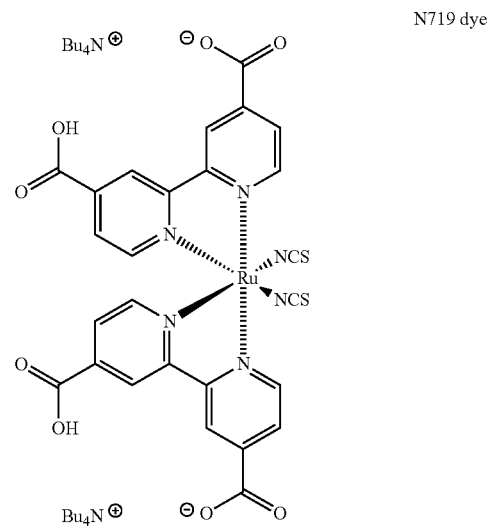

N719 dye

Analysis

Molar absorption coefficients of the compounds of Formulas 4 and 5 were measured and the results are shown in Table 1 below. For comparison with the molar absorption coefficients of the dyes of Examples 1 and 2, i.e., compounds of Formulas 4 and 5, the molar absorption coefficient of the N719 dye of Reference Example 1, that is, a ruthenium dye, was also measured. Herein, the molar absorption coefficient was obtained by measuring UV of a sample, having an accurately known concentration, by using a UV spectrometer, measuring the intensity of a wavelength having the highest UV absorption, and then substituting the values into Equation represented as a=ebc, where e=molar absorption coefficient, a=intensity, b=sample concentration, and c=speed of light.

TABLE 1

|  | Compound of Formula 4 | Compound of Formula 5 | N719 dye |
|---|---|---|---|
| Molar absorption coefficient ($dm^3mol^{-1}cm^{-1}$) | 48140 | 15188 | 13000 |

From the results shown in Table 1, the compounds of Formulas 4 and 5 had a higher molar absorption coefficient than that of the ruthenium dye.

Figure 2:
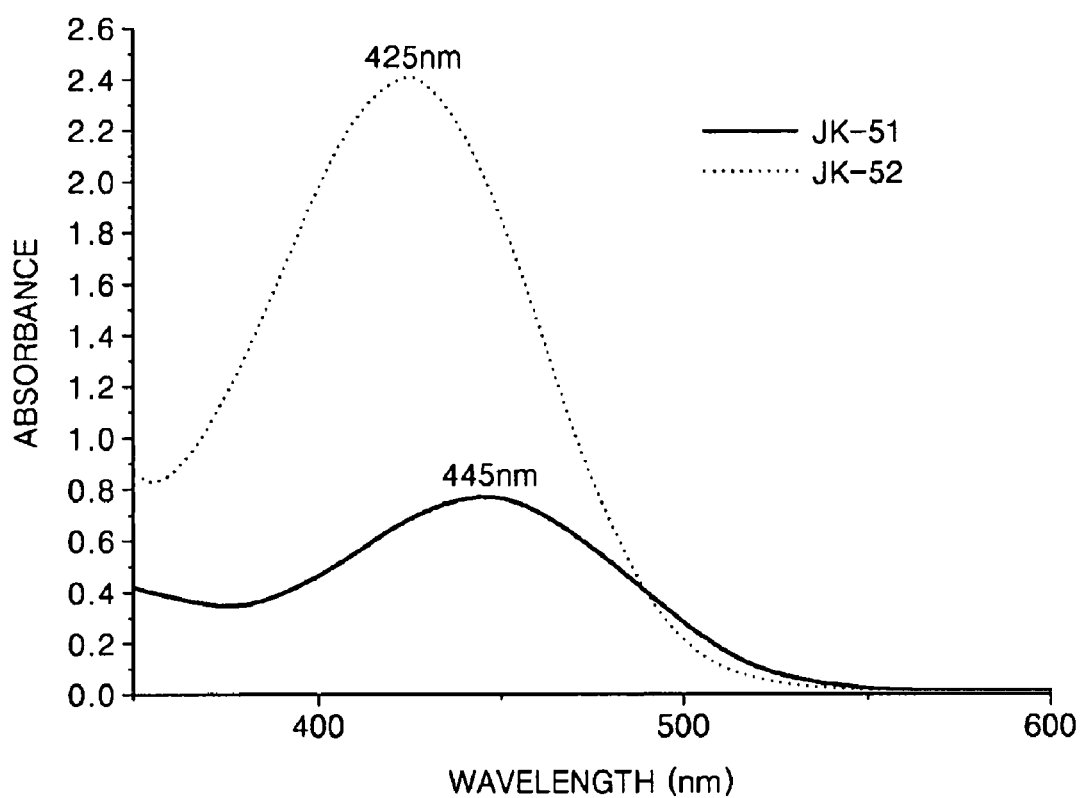
FIG. 2 is a graph showing UV absorption spectra of the compound of Formula 4 and the compound of Formula 5 that were prepared in Synthesis Examples 1 and 2.
Figure 3:
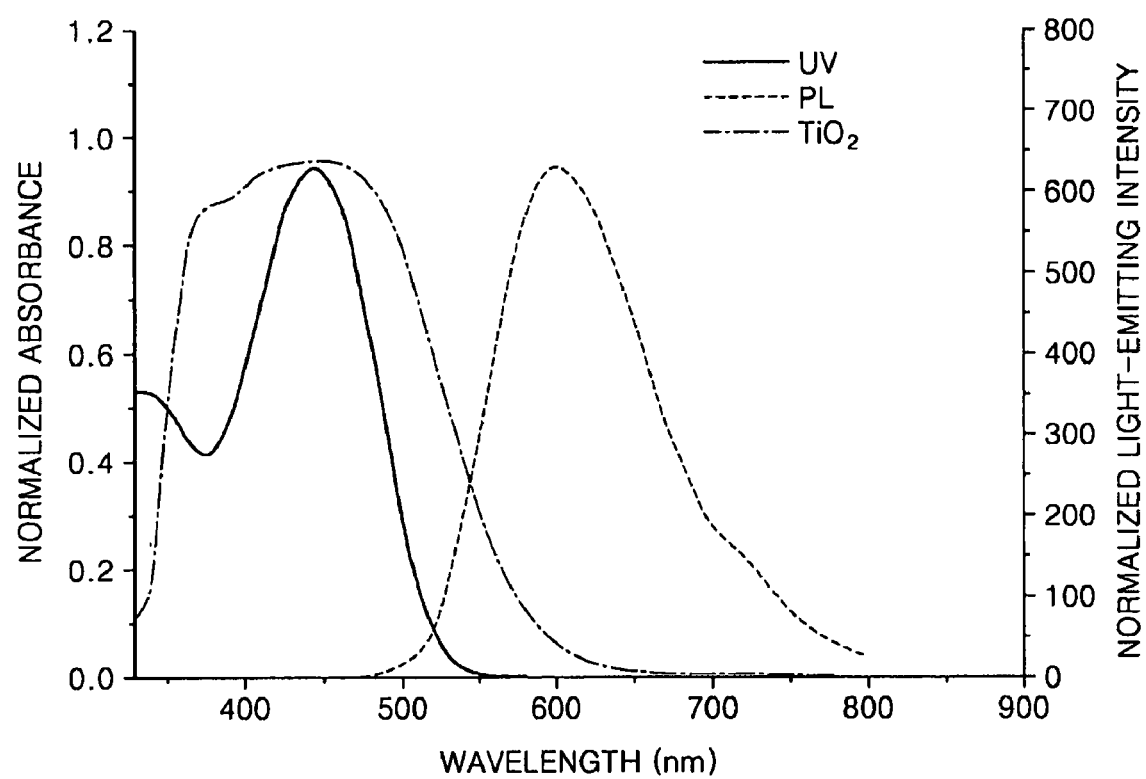
FIG. 3 is a graph showing UV absorption spectra of the compound of Formula 4 prepared in Synthesis Example 1.
Figure 4:
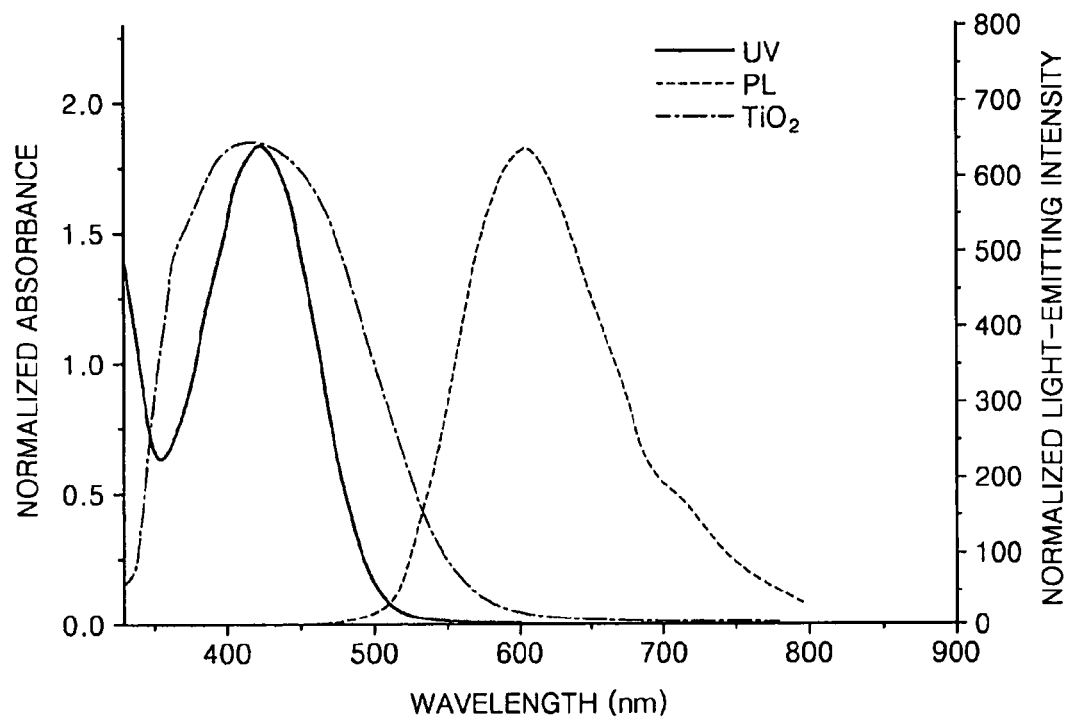
FIG. 4 is a graph showing UV absorption spectra of the compound of Formula 5 prepared in Synthesis Example 2.

UV absorption spectra of the compounds of Formulas 4 and 5 that were prepared in Synthesis Examples 1 and 2 were measured, and the results are shown in FIGS. 2 through 4. FIG. 2 is a graph showing UV absorption spectra of the compound of Formula 4 and the compound of Formula 5 that were prepared in Synthesis Examples 1 and 2, and FIGS. 3 and 4 are graphs showing UV absorption spectra of the compound of Formula 4 and the compound of Formula 5, respectively, that were prepared in Synthesis Examples 1 and 2. The term "UV" used in FIGS. 3 and 4 represents UV absorption properties of the compounds of Formulas 4 and 5, the term "PL" refers to the compounds of Formulas 4 and 5 adsorbed to $TiO_2$, and the term "$TiO_2$" refers to $TiO_2$ itself.

Referring to FIG. 2, the compound of Formula 4 (JK-51) had a maximum absorption wavelength of about 445 nm in a visible region of light, and the compound of Formula 5 (JK-52) had a maximum absorption wavelength of about 425 nm in a visible region of light. In addition, referring to FIGS. 3 and 4, the compounds of Formulas 4 and 5 had a much wider UV absorption band after being adsorbed to TiO$_2$, i.e., the PL data of FIGS. 3 and 4 were broader than the UV data.

In addition, cyclovoltametry of each of the compounds of Formulas 4 and 5 that were prepared in Synthesis Examples 1 and 2 was performed, and the results are shown in Table 2 below.

TABLE 2

|  | $E_{ox}{}^a$ ($\Delta E_p$)/V | $E_{0-0}{}^b$/V | $E_{LUMO}{}^f$/ V vs NHE |
|---|---|---|---|
| Compound of Formula 4 | 1.30 (0.27) | 2.38 | −1.08 |
| Compound of Formula 5 | 1.53 (0.39) | 2.44 | −0.91 |

In Table 2, a: Redox potential of dyes on TiO$_2$ (HOMO) $E_{ox}$ was measured in CH$_3$CN with 0.1 M (n-C$_4$H$_9$)$_4$NPF$_6$, such that a scan rate is 50 mVs$^{-1}$, b: $E_{0-0}$ (energy gap between the HOMO and the LUMO) was determined from intersection of absorption and emission spectra in ethanol, f: $E_{LUMO}$ was calculated by a difference between $E_{ox}$ and $E_{0-0}$.

From the results shown in Table 2, by comparing the LUMO potentials of the compounds of Formulas 4 and 5 with the potential of a conduction band (−0.5 V) of TiO$_2$, it can be seen that the compounds of Formulas 4 and 5 had bands that facilitate electron injection.

Figure 5A:
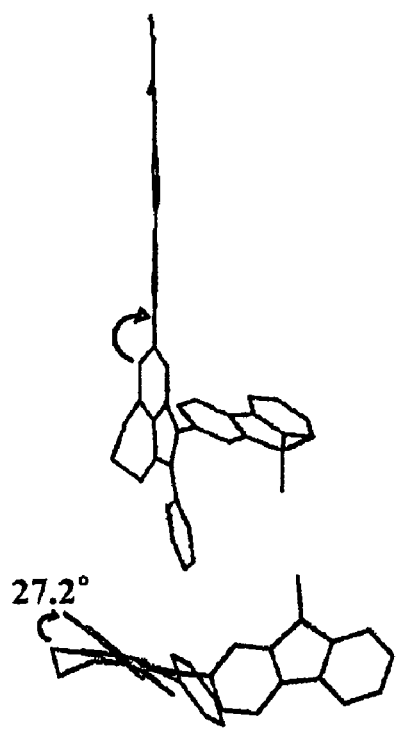
FIGS. 5A to 5D are diagrams illustrating structures in the HOMO and the LUMO of the compound of Formula 4 and the compound of Formula 5 that were prepared in Synthesis Examples 1 and 2, where the structures of the compounds are obtained by a molecular calculation using a TD-DFT method.
Figure 5B:
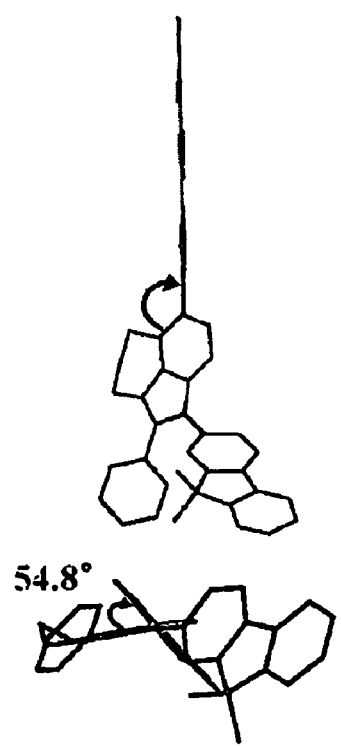
Figure 5C:
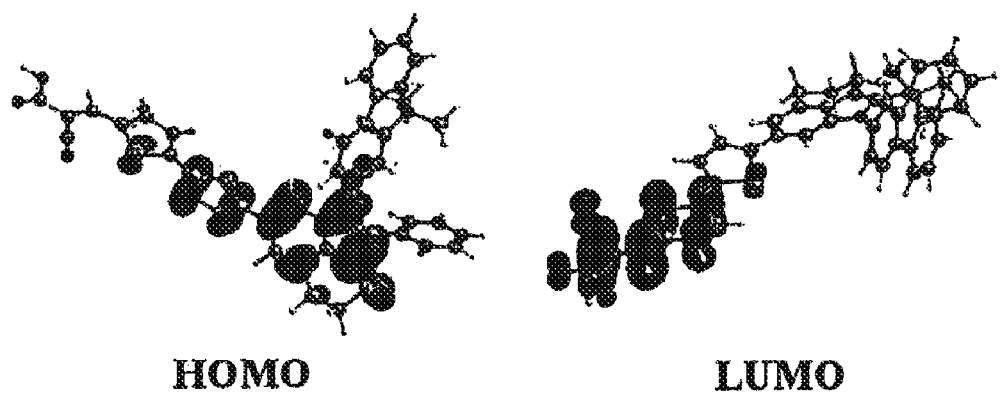
Figure 5D:
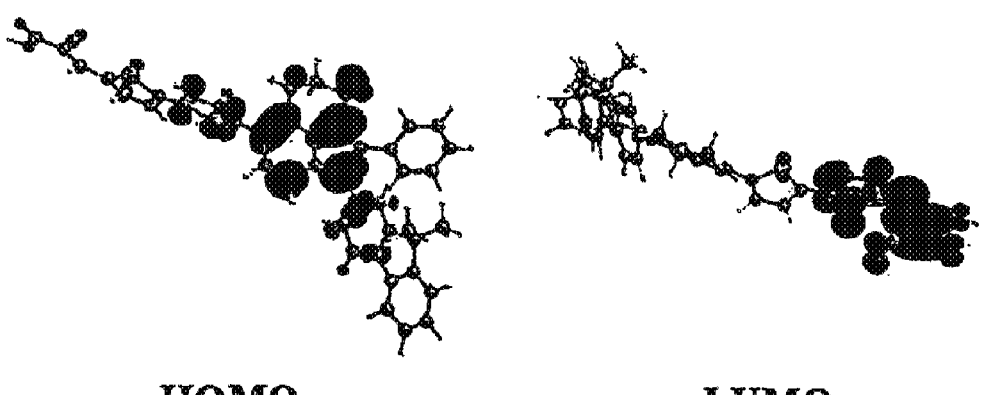

Molecular calculation was performed on the compounds of Formulas 4 and 5 that were prepared in Synthesis Examples 1 and 2 according to the time dependent density functional theory (TD-DFT) so as to determine optimized structures and molecular structures in the HOMO and the LUMO of the compounds of Formulas 4 and 5. The results are shown in FIGS. 5A to 5D. FIGS. 5A and 5C correspond to the compound of Formula 4, and FIGS. 5B and 5D refer to the compound of Formula 5.

Referring to the drawing, the HOMO is localized well on benzo[cd]indole of the dyes of Formulas 4 and 5, and the LUMO is localized well on COOH of the dyes. In terms of electron transfer from the HOMO to the LUMO, smooth electron transfer in a connection part between benzo[cd]indole (HOMO) and the —COOH (LUMO) is very important; and herein, the conjugation formation of molecules plays a critical role in the smooth electron transfer. In the case of the compound of Formula 4, a bonding angle of about 27.2° between the HOMO-benzo[cd]indole and the LUMO-COOH is small as shown in FIG. 5A, and thus distortion therebetween is small, resulting in relatively less conjugation failure compared to the compound of Formula 5 as shown in FIG. 5B, having a bonding angle of about 54.8°. Thus, the efficiency of the compound of Formula 4 was higher than that of the compound of Formula 5.

Optical current-voltage of each of the dye-sensitized solar cells of the Examples 1 and 2, i.e., the solar cells using compounds of Formulas 4 and 5, respectively, and the Reference Example 1 was measured. Open-circuit voltage, current density, and fill factor thereof were calculated from the measured optical current curve, and the efficiencies of the dye-sensitized solar cells were evaluated therefrom. The results are shown in Table 3 below. Herein, a Xenon lamp was used as a light source, and the solar conditions of the Xenon lamp were corrected using a standard solar cell (Frunhofer Institute Solare Engeriessysysteme, Certificate No. C-ISE369, Type of material: Mono-Si+KG filter). Herein, the efficiencies were measured at 100 mW/cm$^2$.

TABLE 3

|  | Current density (Jsc) (mAcm$^{-2}$) | Open-circuit voltage (Voc) (V) | Fill factor (FF) | Efficiency η (%) |
|---|---|---|---|---|
| Example 1 | 17.43 | 0.680 | 0.71 | 8.42 |
| Example 2 | 15.56 | 0.626 | 0.70 | 6.88 |
| Reference Example 1 | 19.42 | 0.714 | 0.68 | 9.42 |

Figure 6:
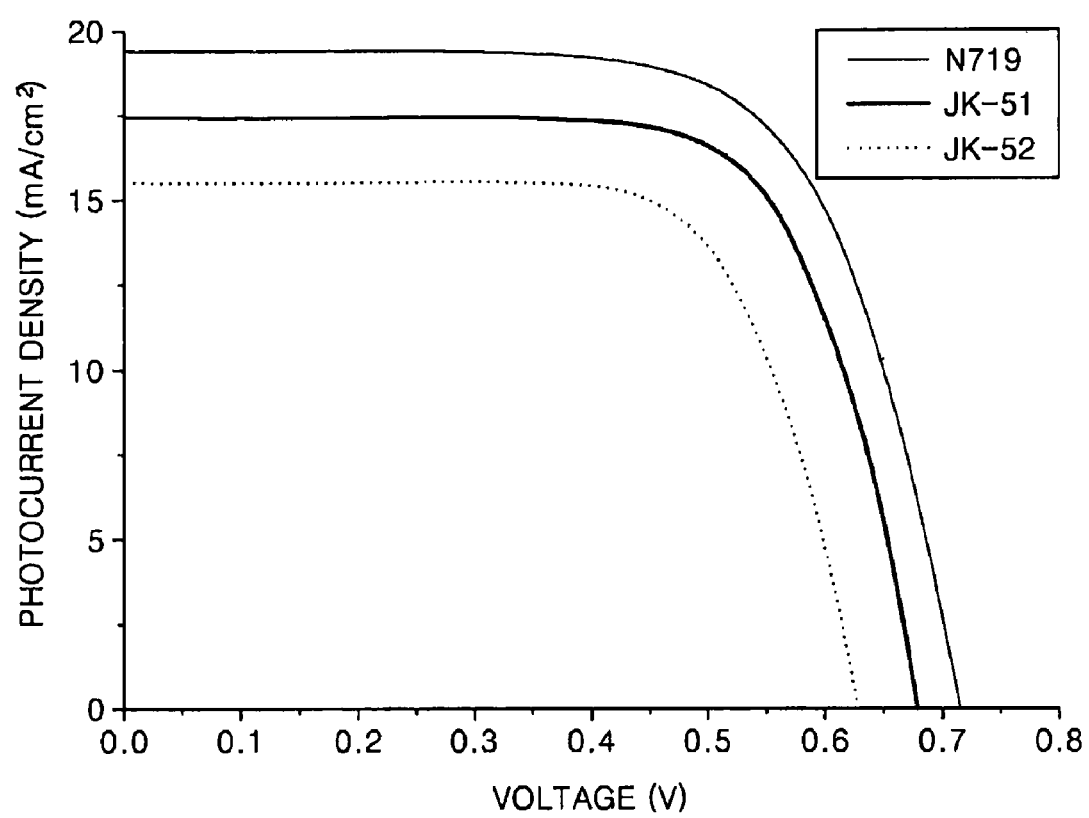
FIG. 6 is a graph showing a change in photocurrent density with respect to voltage of each of the dye-sensitized solar cells prepared in Examples 1 and 2 and Reference Example 1.

In addition, the photocurrent density according to voltage of each of the dye-sensitized solar cells of the Examples 1 and 2 and the Reference Example 1 was measured, and the results are shown in FIG. 6. Referring to FIG. 6, the dye-sensitized solar cells of Examples 1 and 2 had photocurrent density as high as that of the dye-sensitized solar cell of Reference Example 1.

Figure 7:
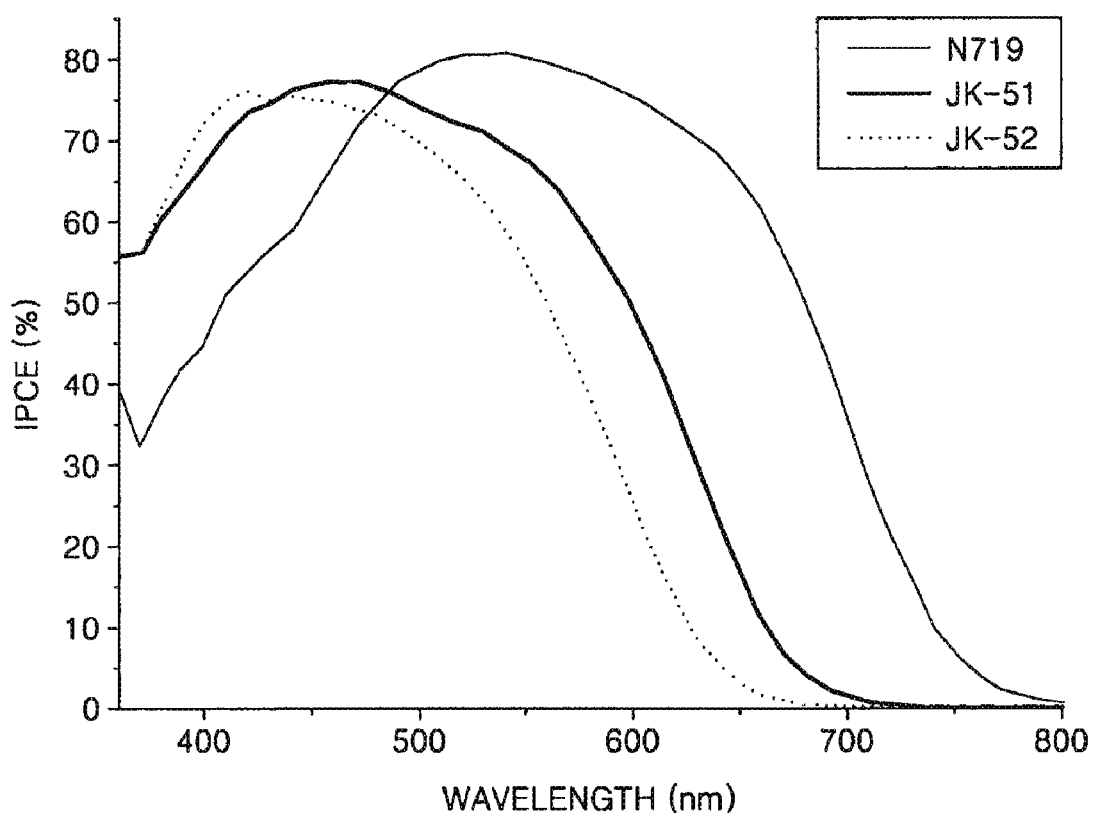
FIG. 7 is a graph showing photo-charge yields of dye-sensitized solar cells prepared in Examples 1 and 2 and Reference Example 1.

In addition, incident photon to current efficiency (IPCE) of each of the dye-sensitized solar cells of the Examples 1 and 2 and the Reference Example 1 was measured, and the results are shown in FIG. 7. As shown in FIG. 7, it can be seen that the dye-sensitized solar cells of the Examples 1 and 2 had a capability of generating electricity by absorbing light having a wavelength in a visible spectral region of 700 nm or less, and had higher IPCE in a unit wavelength than that of the dye-sensitized solar cell of Reference Example 1. That is, the current amounts of the dye-sensitized solar cells of the Examples 1 and 2 were larger than that of the dye-sensitized solar cell of Reference Example 1.

The benzoindole-based compound according to aspects of the present invention used as a dye for a dye-sensitized solar cell is prepared at a low cost, has a high molar absorption coefficient, and has high photoelectron conversion efficiency, as compared to a conventional ruthenium dye.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A dye for a dye-sensitized solar cell, the dye comprising a benzoindole-based compound represented by Formula 1:

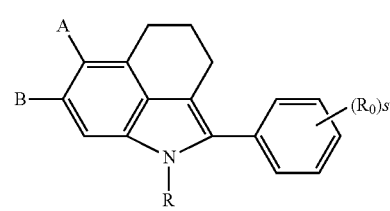

<Formula 1> wherein A and B are each independently hydrogen or -D-E, and A and B are not simultaneously hydrogen,
D is selected from the group consisting of a substituted or unsubstituted C$_6$-C$_{20}$ aryl group, a substituted or unsubstituted C$_2$-C$_{20}$ heteroaryl group, a substituted or unsubstituted C$_4$-C$_{20}$ carbocyclic group, a substituted or unsubstituted C$_4$-C$_{20}$ heterocyclic group, and combinations thereof,
E is an acidic functional group,
R is selected from the group consisting of a substituted or unsubstituted C$_1$-C$_{20}$ alkyl group, a substituted or unsubstituted C$_6$-C$_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof, $R_0$ is selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof, and s is an integer of 0 to 5.

2. The dye for a dye-sensitized solar cell of claim 1, wherein D is represented by the following formula:

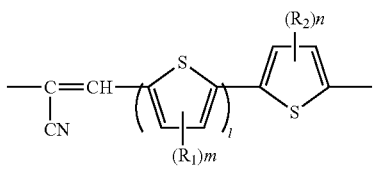

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, l is 0 or 1, and m and n are each independently an integer of 0 to 2.

3. The dye for a dye-sensitized solar cell of claim 1, wherein A and B are each independently hydrogen or groups represented by the following formula:

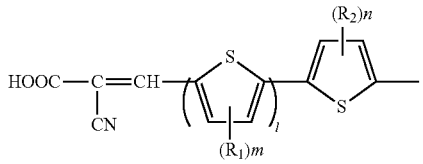

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, l is 0 or 1, and m and n are each independently an integer of 0 to 2.

4. The dye for a dye-sensitized solar cell of claim 3, wherein A and B are not a same group.

5. The dye for a dye-sensitized solar cell of claim 1, wherein R is represented by the following formula:

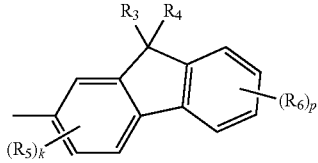

wherein $R_3$ and $R_4$ are each independently selected from the group consisting of hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, $R_5$ and $R_6$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, and k is an integer of 0 to 3, and p is an integer of 0 to 4.

6. The dye for a dye-sensitized solar cell of claim 1, wherein R is a fluorene group.

7. The dye for a dye-sensitized solar cell of claim 1, wherein E is selected from the group consisting of a carboxyl group, a phosphorous acid group, a sulfonic acid group, a phosphinic acid group, a hydroxyl group, an oxycarboxylic acid group, an acid amide group, a boric acid group, a squaric acid group, and combinations thereof.

8. The dye for a dye-sensitized solar cell of claim 1, wherein the benzoindole-based compound is represented by Formula 2 or 3:

<Formula 2>

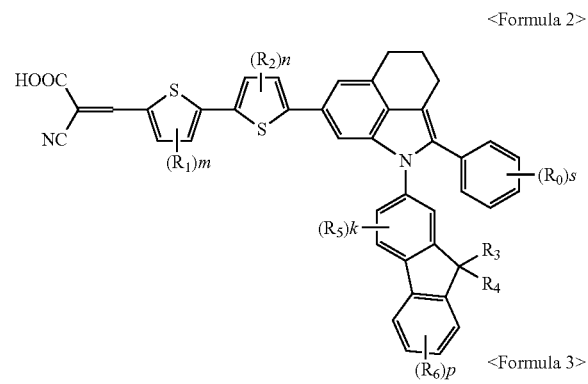

<Formula 3>

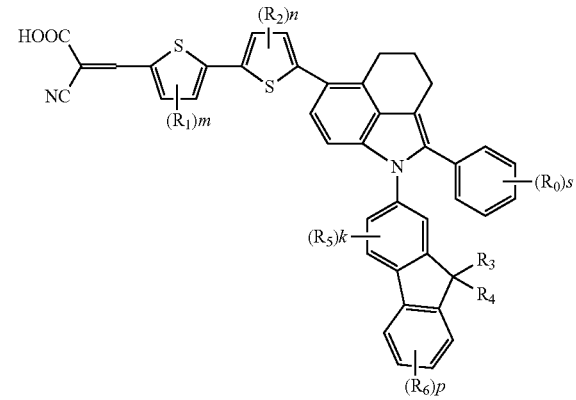

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, m and n are each independently an integer of 0 to 2, $R_3$ and $R_4$ are each independently selected from the group consisting of hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, $R_5$ and $R_6$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, and k is an integer of 0 to 3, and p is an integer of 0 to 4.

9. The dye for a dye-sensitized solar cell of claim 1, wherein the benzoindole-hased compound is represented by Formula 4 or 5:

<Formula 4>

<Formula 5>

10. A dye-sensitized solar cell, comprising:
a first electrode and a second electrode disposed to face each other;
a porous film disposed between the first electrode and the second electrode in which a dye is adsorbed to produce a voltage potential between the first electrode and the second electrode from absorption of light, the dye comprising a benzoindole-based compound represented by Formula 1:

<Formula 1> wherein A and B are each independently hydrogen or -D-E, and A and B are not simultaneously hydrogen, D is selected from the group consisting of a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof, E is an acidic functional group, R is selected from the group consisting of a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_4$-$C_{20}$ carbocyclic group, a substituted or unsubstituted $C_4$-$C_{20}$ heterocyclic group, and combinations thereof, $R_0$ is selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, and combinations thereof, and s is an integer of 0 to 5; and an electrolyte between the first electrode and the second electrode.

11. The dye-sensitized solar cell of claim 10, wherein D is represented by the following formula:

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, l is 0 or 1, and m and n are each independently an integer of 0 to 2.

12. The dye-sensitized solar cell of claim 10, wherein A and B are each independently hydrogen or groups represented by the following formula:

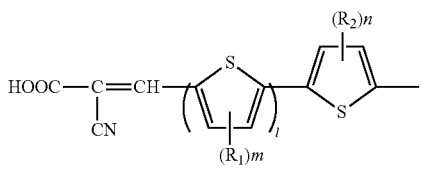

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, l is 0 or 1, and m and n are each independently an integer of 0 to 2.

13. The dye-sensitized solar cell of claim 12, wherein A and B are not a same group.

14. The dye-sensitized solar cell of claim 10, wherein R is represented by the following formula:

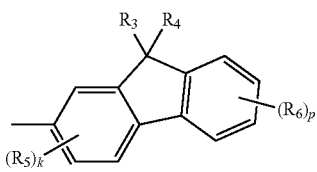

wherein $R_3$ and $R_4$ are each independently selected from the group consisting of hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, $R_5$ and $R_6$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, k is an integer of 0 to 3, and p is an integer of 0 to 4.

15. The dye-sensitized solar cell of claim 10, wherein R is a fluorene group.

16. The dye-sensitized solar cell of claim 10, wherein E is selected from the group consisting of a carboxyl group, a phosphorous acid group, a sulfonic acid group, a phosphinic acid group, a hydroxyl group, an oxycarboxylic acid group, an acid amide group, a boric acid group, a squaric acid group, and combinations thereof.

17. The dye-sensitized solar cell of claim 10, wherein the benzoindole-based compound is represented by Formula 2 or 3:

<Formula 2>

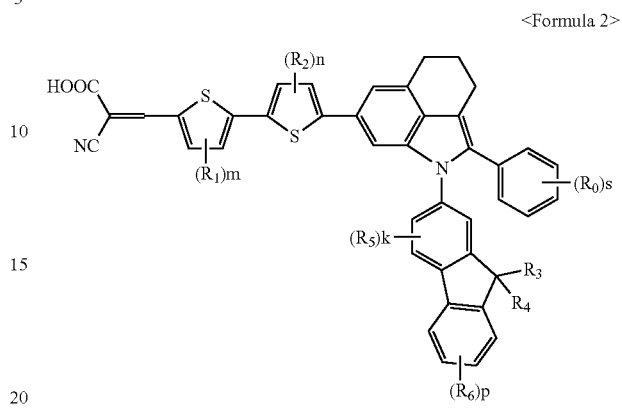

(J)

<Formula 3>

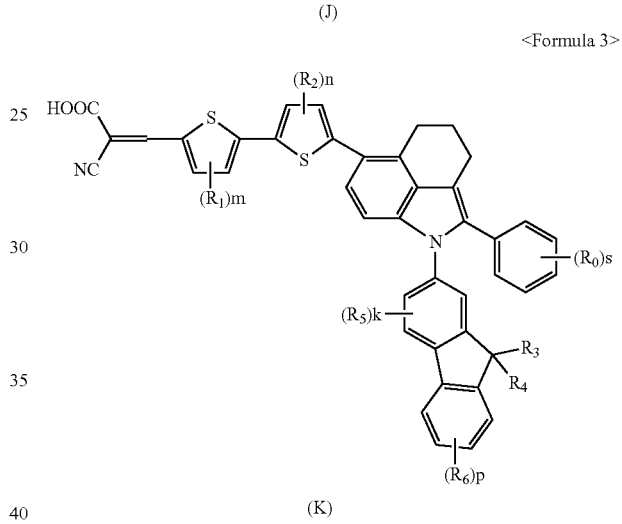

(K)

wherein $R_1$ and $R_2$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, m and n are each independently an integer of 0 to 2, $R_3$ and $R_4$ are each independently selected from the group consisting of hydrogen, a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, $R_5$ and $R_6$ are each independently selected from the group consisting of a $C_1$-$C_{20}$ alkyl group, a halogen atom, a nitro group, a cyano group, a $C_1$-$C_{20}$ alkoxy group, a $C_1$-$C_{20}$ alkylamino group, a hydroxyl group, a $C_6$-$C_{20}$ aryl group, a $C_1$-$C_{20}$ alkylthio group, an amino group, a $C_6$-$C_{20}$ aryloxy group, a $C_2$-$C_{20}$ heteroaryl group, a $C_4$-$C_{20}$ heterocyclic group, a $C_2$-$C_{20}$ alkenyl group, a $C_2$-$C_{20}$ alkynyl group, a $C_2$-$C_{20}$ carbocyclic group, and combinations thereof, and k is an integer of 0 to 3, and p is an integer of 0 to 4.

18. A benzoindole-based dye for a dye-sensitized solar cell, the dye comprising:
- an N-aryl electron donor comprising a tetrahydrobenzo[cd]indole; and
- an acidic functional group electron acceptor comprising —COOH.

19. The benzoindole-based dye of claim 18, wherein highest occupied molecular orbitals are localized near the electron donor and lowest unoccupied molecular orbitals are localized near the electron acceptor.

20. The benzoindole-based dye of claim 19, wherein the highest occupied molecular orbitals and the lowest unoccupied molecular orbitals are separated by a bond angle of about 25 to 55°.

* * * * *